(12) United States Patent
Park et al.

(10) Patent No.: US 12,433,084 B2
(45) Date of Patent: Sep. 30, 2025

(54) DISPLAY DEVICE

(71) Applicant: LG ELECTRONICS INC., Seoul (KR)

(72) Inventors: Byunghun Park, Seoul (KR); Sunghwan Kim, Seoul (KR); Hongkyu Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/726,076

(22) PCT Filed: Jan. 5, 2022

(86) PCT No.: PCT/KR2022/000129
§ 371 (c)(1),
(2) Date: Jul. 1, 2024

(87) PCT Pub. No.: WO2023/132379
PCT Pub. Date: Jul. 13, 2023

(65) Prior Publication Data
US 2025/0113685 A1    Apr. 3, 2025

(51) Int. Cl.
*G09G 3/32* (2016.01)
*H10F 39/90* (2025.01)
(Continued)

(52) U.S. Cl.
CPC ............. *H10H 29/34* (2025.01); *G09G 3/32* (2013.01); *H10F 39/90* (2025.01); *H10H 29/24* (2025.01);
(Continued)

(58) Field of Classification Search
CPC ........ H10H 29/34; H10H 29/24; H10F 39/90; G09G 3/32; G09G 3/0421;
(Continued)

(56) References Cited

U.S. PATENT DOCUMENTS 8,446,390 B2 * 5/2013 Hattori ................ G02F 1/13338
345/173
10,248,249 B2 * 4/2019 Liu ..................... G06V 40/1359
(Continued)

FOREIGN PATENT DOCUMENTS

JP    20080262176    10/2008
KR    1020090104319  10/2009
(Continued)

OTHER PUBLICATIONS

PCT International Application No. PCT/KR2022/000129, International Search Report dated Sep. 21, 2022, 3 pages.

*Primary Examiner* — Kenneth Bukowski
(74) *Attorney, Agent, or Firm* — LEE, HONG, DEGERMAN, KANG & WAIMEY

(57) ABSTRACT

A display device may include first to third semiconductor light-emitting devices in each of a plurality of pixels, a sensing element, and a circuit block in each of the plurality of pixels. The sensing element may include a fourth semiconductor light-emitting device. The first to third semiconductor light-emitting devices may emit light during the first section by a power source having a forward bias. The fourth semiconductor light-emitting device may be light-received by a power source having a reverse bias.

15 Claims, 17 Drawing Sheets

(51) Int. Cl.
*H10H 29/24* (2025.01)
*H10H 29/34* (2025.01)
*G06F 3/042* (2006.01)
*G06V 40/13* (2022.01)

(52) U.S. Cl.
CPC ........ *G06F 3/0421* (2013.01); *G06V 40/1318* (2022.01); *G09G 2300/0842* (2013.01); *G09G 2310/08* (2013.01); *G09G 2320/0613* (2013.01); *G09G 2320/0626* (2013.01); *G09G 2354/00* (2013.01); *G09G 2360/144* (2013.01)

(58) Field of Classification Search
CPC ....... G09G 2300/0842; G09G 2310/08; G09G 2320/0613; G09G 2320/0626; G09G 2354/00; G09G 2360/144; G06V 40/1318

See application file for complete search history.

(56) References Cited

U.S. PATENT DOCUMENTS

| | | | | |
|---|---|---|---|---|
| 2006/0244693 | A1* | 11/2006 | Yamaguchi | H10K 59/60 345/76 |
| 2008/0252223 | A1 | 10/2008 | Toyoda et al. | |
| 2010/0020009 | A1* | 1/2010 | Nakanishi | G01J 1/4204 345/102 |
| 2022/0352265 | A1 | 11/2022 | Takahashi et al. | |
| 2023/0074731 | A1* | 3/2023 | Lin | H10H 20/852 |
| 2024/0237376 | A9* | 7/2024 | Kusunoki | G09G 3/3208 |

FOREIGN PATENT DOCUMENTS

| | | |
|---|---|---|
| KR | 1020100118716 | 11/2010 |
| KR | 101464012 | 11/2014 |
| KR | 1020160056388 | 5/2016 |
| KR | 1020170133022 | 12/2017 |
| KR | 1020180049934 | 5/2018 |
| WO | 2021064518 | 4/2021 |

* cited by examiner

DISPLAY DEVICE

CROSS-REFERENCE TO RELATED APPLICATION(S)

This application is the National Stage filing under 35 U.S.C. 371 of International Application No. PCT/KR2022/000129, filed on Jan. 5, 2022, the contents of which are all incorporated by reference herein in its entirety.

BACKGROUND OF THE DISCLOSURE

Field

The embodiment relates to a display device.

Discussion of the Related Art

The display device displays high-quality images by using self-luminous elements such as light-emitting diodes as light sources for pixels. The light-emitting diodes are attracting attention as a light source for next-generation display devices because they exhibit excellent durability even under harsh environmental conditions and have long lifespans and high brightness.

Recently, research is being conducted to manufacture ultra-small light-emitting diodes using highly reliable inorganic crystal structure materials and to use them as next-generation light sources by disposing them on a panel of a display device (hereinafter referred to as "display panel").

These display devices are expanding beyond flat panel displays to various forms such as flexible displays, foldable displays, stretchable displays, rollable displays, etc.

In order to implement high resolution, since pixel sizes are gradually decreasing, and light-emitting devices must be aligned to numerous pixels of such small sizes, research on the manufacture of ultra-small light-emitting diodes of micro or nano scale is actively being conducted.

Typically, display devices include tens of millions or more pixels. Therefore, it is very difficult to align at least one or more light-emitting device to each of tens of millions or more small pixels. Therefore, various studies on methods for aligning light-emitting devices on display panels are actively being conducted recently.

As the size of light-emitting devices decreases, the task of quickly and accurately transferring these light-emitting devices onto a substrate is emerging as a very important issue. Transfer technologies being developed recently include the pick and place process, the laser lift-off method, the self-assembly method, etc. In particular, the self-assembly method, which transfers light-emitting devices onto a substrate using a magnetic body (or magnet), is recently in the spotlight.

In the self-assembly method, numerous light-emitting devices are dropped into a fluid-containing chamber, and the light-emitting devices dropped into the fluid are moved to the pixels of the substrate according to the movement of the magnetic body, so that the light-emitting devices are aligned to each pixel. Therefore, the self-assembly method is in the spotlight as a next-generation transfer method because it can quickly and accurately transfer numerous light-emitting devices onto the substrate.

Meanwhile, the display devices with sensing functions are in the spotlight.

Widely known sensing methods in the display devices include infrared touch technology, camera touch technology, electrostatic capacitance touch technology, etc.

In the infrared touch technology, multiple infrared light-emitting devices and light-receiving units are disposed around the perimeter of the substrate, and touch is detected based on whether the infrared light from the infrared light-emitting devices is received by the light-receiving unit.

In the electrostatic capacitance touch technology, cameras are disposed at the corner of the substrate, and touch is detected based on the image acquired from the cameras.

In the capacitive touch technology, multiple horizontal and vertical electrodes are separately provided on the substrate, and output signals are applied to the horizontal electrodes and the corresponding output signals are received by the vertical electrodes. At this time, depending on whether or not a touch is made, the output signals received by the vertical electrodes change due to the changes in electrostatic capacities, and the touch is detected based on the different values of the output signals.

However, since both infrared touch technology and camera touch technology require numerous infrared light-emitting devices must be disposed on the outside of the substrate or multiple cameras must be installed, bezel-less implementation is difficult and expensive. In addition, if the substrate has a large area and the touch is made at the center of the substrate, the distance between the infrared light-emitting devices, the camera, and the center of the substrate is long, so that the accuracy of sensing is low.

In addition, since electrostatic capacitance touch technology has numerous electrodes disposed on the substrate, the display device has a thick and complex configuration. It is difficult to implement large-area electrostatic capacitance touch technology due to the limitations of ITO used as the electrode.

SUMMARY OF THE DISCLOSURE

An object of the embodiment is to solve the foregoing and other problems.

Another purpose of the embodiment is to provide a display device having a display function and a sensing function using interactive cell technology.

In addition, another object of the embodiment is to provide a display device implemented with various sensors, that is, an external light sensitive sensor, a proximity sensor, a touch sensor, and a fingerprint sensor.

In addition, another object of the embodiment is to provide a display device having a bezel-less display even if it has a sensing function.

In addition, another object of the embodiment is to provide a display device that can prevent an increase in thickness even if it has a sensing function.

In addition, another object of the embodiment is to provide.

The technical problems of the embodiments are not limited to those described in this item and include those that can be understood through the description of the invention.

In order to achieve the above or other objects, according to one aspect of the embodiment, a display device, comprising: first to third semiconductor light-emitting devices in each of a plurality of pixels; a sensing element; and a circuit block in each of the plurality of pixels, wherein the sensing element comprises a fourth semiconductor light-emitting device.

An image may be displayed in units of frames, and it may be operated in an emission mode and a sensing mode during one section of one frame An image may be displayed in units of frames, and one frame may comprise a first section driven in an emission mode and a second section driven in a sensing mode.

The first to third semiconductor light-emitting devices may emit light during the first section by a power source having a forward bias, and a first sensing signal is configured to output from the fourth semiconductor light-emitting device during the second section by a power source having a reverse bias.

The circuit block may comprise: a first circuit block configured to control the emission of each of the first to third semiconductor light-emitting devices; and a second circuit block configured to control the detection of a second sensing signal.

The second section may comprise a second-first section and a second-second section, and the second circuit block may comprise: a comparator configured to output the second sensing signal based on the first sensing signal and a reference value; a first switch configured to control to apply the power having the reverse bias to the fourth semiconductor light-emitting device during the second-first section; and a second switch configured to control the output of the second sensing signal during the second-second section.

The second circuit block may comprise: a third switch configured to control the application of the reference value to a second input terminal of the comparator.

The second circuit block may comprise: a capacitor configured to store the applied reference value between the comparator and the third switch.

The display device may further comprise: a sensitivity adjuster configured to change the reference value to adjust a sensitivity of the first sensing signal.

The sensitivity adjuster may obtain a correction value based on a brightness of the image, and change the reference value based on the correction value.

The sensitivity adjuster may periodically change the reference value.

The sensitivity adjuster may change the reference value at different cycles depending on a type of image.

The sensing element may comprise one of a photo diode, a photo detector, and a photo sensor.

The display device may further comprise: a partition wall having a plurality of holes on a substrate, wherein the first to fourth semiconductor light-emitting devices is disposed in the holes, respectively.

The circuit block may be built into the substrate or comprises an integrated circuit disposed on the substrate.

As illustrated in FIG. 7, when implementing an image by the first color light of the first semiconductor light-emitting device 391, the second color light of the second semiconductor light-emitting device 392, and the third color light of the third semiconductor light-emitting device 393 for each pixel, various sensors, i.e., an external light-sensitive sensor (FIG. 18), a proximity sensor (FIG. 19), a touch sensor (FIG. 20), and a fingerprint sensor (FIG. 21), can be implemented by using a semiconductor light-emitting device having a light-receiving function by a power source with reverse bias as a sensing element 395 to detect a sensing signal corresponding to internal light or external light.

According to the embodiment, by using the first color light of the first semiconductor light-emitting device 391, the second color light of the second semiconductor light-emitting device 392, and the third color light of the third semiconductor light-emitting device 393 as internal light for the sensing function, there is no need to provide a separate light-emitting structure, so that the cost can be drastically reduced and the structure can be simplified.

According to the embodiment, the fourth semiconductor light-emitting device of micrometer size or less can be easily applied as the sensing element 395 to a micro or nano display device that implements an image using the first semiconductor light-emitting device 391, the second semiconductor light-emitting device 392, and the third semiconductor light-emitting device 393 having a micrometer size, so that the range of application of the sensing function can be expanded.

According to the embodiment, the sensing element 395 can be provided pixel by pixel or sub-pixel by sub-pixel, so that the degree of freedom in the design layout can be expanded, so that it can easily respond to the requirements of set makers, i.e., television manufacturers.

According to an embodiment, the sensing element 395 having a size of less than a micrometer can be easily assembled on a substrate using a self-assembly method, thereby overcoming the difficulty of arranging a micro-sized sensor.

According to an embodiment, by adjusting the reference value VREF in consideration of sensitivity in units of frames, periodically, or according to the type of image, the sensitivity performance of the first sensing signal SENSE1 output from the fourth semiconductor light-emitting device with the sensing element 395 is improved, so that the accuracy of detection of the second sensing signal SENSE2 is increased, and thus reliability can be improved.

Additional scope of applicability of the embodiments will become apparent from the detailed description that follows. However, since various changes and modifications within the spirit and scope of the embodiments may be clearly understood by those skilled in the art, the detailed description and specific embodiments, such as preferred embodiments, should be understood as being given by way of example only.

Figure 1:
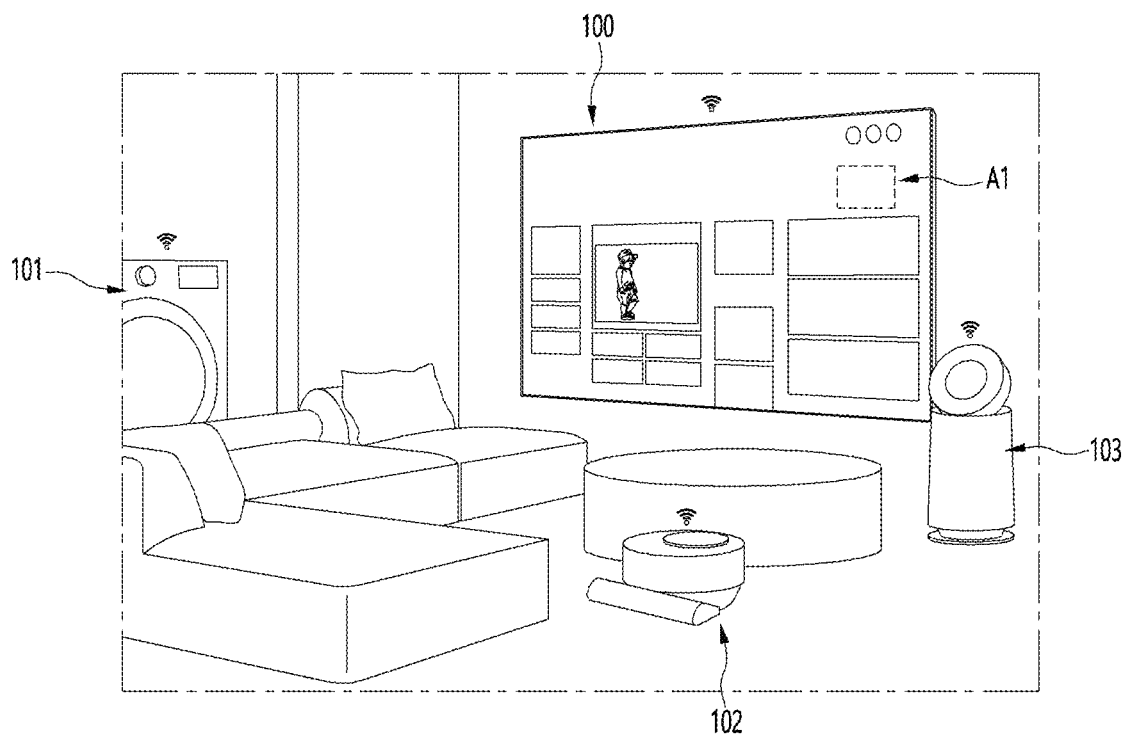
FIG. 1 illustrates a living room of a house in which a display device according to an embodiment is disposed.

The sizes, shapes, dimensions, etc. of elements illustrated in the drawings can differ from actual ones. In addition, even if the same elements are illustrated in different sizes, shapes, dimensions, etc. between the drawings, this is only an example on the drawing, and the same elements have the same sizes, shapes, dimensions, etc. between the drawings.

DETAILED DESCRIPTION OF EMBODIMENTS

Hereinafter, the embodiment disclosed in this specification will be described in detail with reference to the accompanying drawings, but the same or similar elements are given the same reference numerals regardless of reference numerals, and redundant descriptions thereof will be omitted. The suffixes 'module' and 'unit' for the elements used in the following descriptions are given or used interchangeably in consideration of ease of writing the specification, and do not themselves have a meaning or role that is distinct from each other. In addition, the accompanying drawings are for easy understanding of the embodiment disclosed in this specification, and the technical idea disclosed in this specification is not limited by the accompanying drawings. Also, when an element such as a layer, region or substrate is referred to as being 'on' another element, this means that there can be directly on the other element or be other intermediate elements therebetween.

The display device described in this specification may comprise a TV, a signage, a mobile phone, a smart phone, a head-up display (HUD) for a vehicle, a backlight unit for a laptop computer, a display for VR or AR, etc. However, the configuration according to the embodiment described in this specification may be applied to a device capable of displaying, even if it is a new product type developed in the future.

The following describes a light-emitting device according to an embodiment and a display device including the same.

FIG. 1 illustrates a living room of a house in which a display device according to an embodiment is disposed.

Referring to FIG. 1, the display device 100 according to the embodiment can display the status of various electronic products such as a washing machine 101, a robot vacuum cleaner 102, an air purifier 103, etc., and can communicate with each electronic product based on IoT and control each electronic product based on user setting data.

The display device 100 according to the embodiment may comprise a flexible display manufactured on a thin and flexible substrate. The flexible display can be bent or rolled like paper while maintaining the characteristics of an existing flat display.

In a flexible display, visual information can be implemented by independently controlling the light emission of unit pixels disposed in a matrix form. A unit pixel means a minimum unit for implementing one color. The unit pixel of a flexible display can be implemented by a light-emitting device. In an embodiment, the light-emitting device may be a Micro-LED or a Nano-LED, but is not limited thereto.

Figure 2:
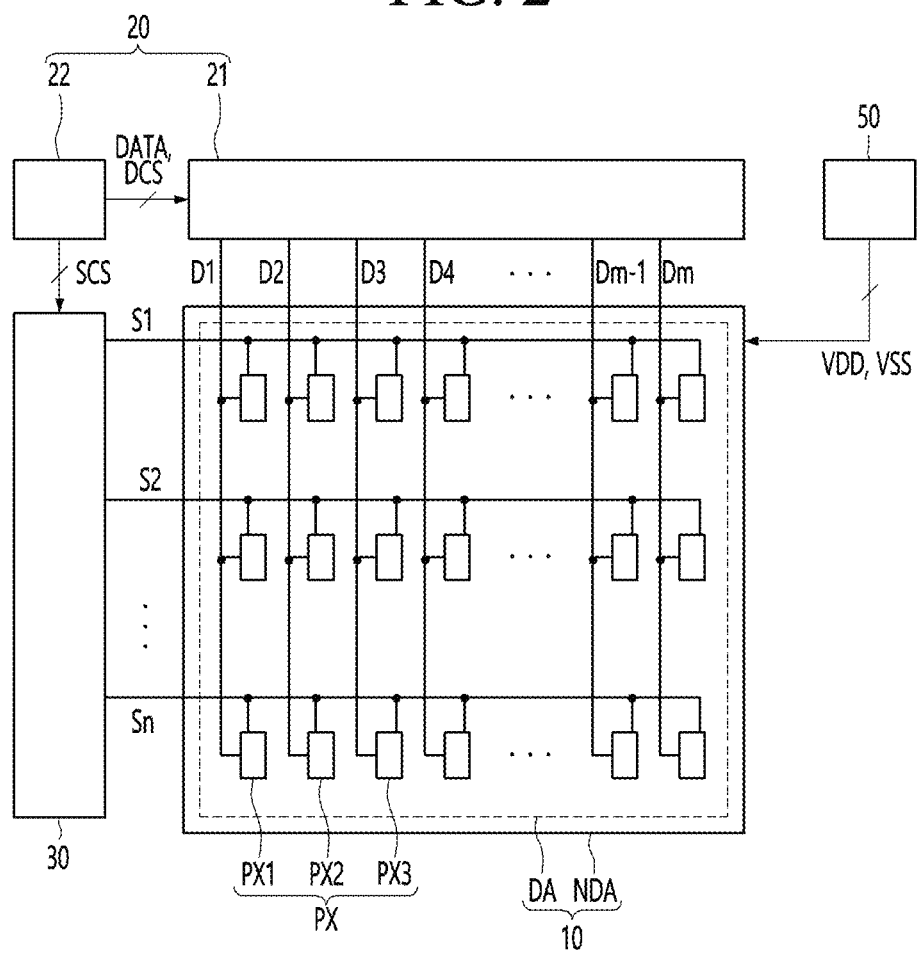
FIG. 2 is a block diagram schematically showing a display device according to an embodiment.
Figure 3:
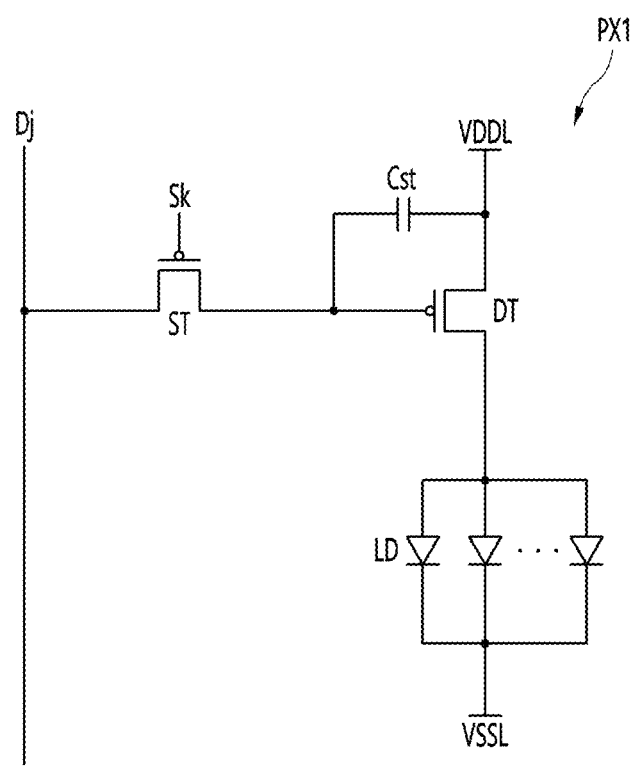
FIG. 3 is a circuit diagram showing an example of a pixel of FIG. 2.

FIG. 2 is a block diagram schematically showing a display device according to an embodiment, and FIG. 3 is a circuit diagram showing an example of a pixel of FIG. 2.

Referring to FIG. 2 and FIG. 3, a display device according to an embodiment may comprise a display panel 10, a driving circuit 20, a scan driving circuit 30, and a power supply circuit 50.

The display device 100 of the embodiment may drive a light-emitting device in an active matrix (AM) method or a passive matrix (PM) method.

The driving circuit 20 may comprise a data driving circuit 21 and a timing controller 22.

The display panel 10 may be formed in a rectangular shape, but is not limited thereto. That is, the display panel 10 may be formed in a circular or oval shape. At least one side of the display panel 10 may be formed to be bent at a predetermined curvature.

The display panel 10 may be divided into a display area DA and a non-display area NDA disposed around the display area DA. The display area DA is an area where pixels PX are formed to display an image. The display panel 10 may comprise data lines (D1 to Dm, where m is an integer greater than or equal to 2), scan lines (S1 to Sn, where n is an integer greater than or equal to 2) intersecting the data lines D1 to Dm, a high-potential voltage line VDDL supplied with a high-potential voltage, a low-potential voltage line VSSL supplied with a low-potential voltage, and pixels PXs connected to the data lines D1 to Dm and the scan lines S1 to Sn.

Each of the pixels PXs may comprise a first sub-pixel PX1, a second sub-pixel PX2, and a third sub-pixel PX3. The first sub-pixel PX1 may emit a first color light of a first dominant wavelength, the second sub-pixel PX2 may emit a second color light of a second dominant wavelength, and the third sub-pixel PX3 may emit a third color light of a third dominant wavelength. The first color light may be red light, the second color light may be green light, and the third color light may be blue light, but is not limited thereto. In addition, although FIG. 2 exemplifies that each of the pixels PX comprises three sub-pixels, it is not limited thereto. That is, each of the pixels PX may comprise four or more sub-pixels.

Each of the first sub-pixel PX1, the second sub-pixel PX2, and the third sub-pixel PX3 may be connected to at least one of the data lines D1 to Dm, at least one of the scan lines S1 to Sn, and a high-potential voltage line VDDL. The first sub-pixel PX1 may comprise light-emitting devices LDs, a plurality of transistors for supplying current to the light-emitting devices LDs, and at least one capacitor Cst, as illustrated in FIG. 3.

Although not illustrated in the drawing, each of the first sub-pixel PX1, the second sub-pixel PX2, and the third sub-pixel PX3 may comprise only one light-emitting device LD and at least one capacitor Cst.

Each of the light-emitting devices LDs may be a semiconductor light-emitting diode comprising a first electrode, a plurality of conductivity type semiconductor layers, and a second electrode. Here, the first electrode may be an anode electrode, and the second electrode may be a cathode electrode, but is not limited thereto.

The light-emitting device LD may be one of a lateral-type light-emitting device, a flip-chip light-emitting device, and a vertical-type light-emitting device.

The plurality of transistors may comprise a driving transistor DT for supplying current to the light-emitting devices LD, as illustrated in FIG. 3, and a scan transistor ST for supplying a data voltage to a gate electrode of the driving transistor DT. The driving transistor DT may comprise a gate electrode connected to a source electrode of the scan transistor ST, a source electrode connected to a high-potential voltage line VDDL to which a high-potential voltage is applied, and a drain electrode connected to the first electrodes of the light-emitting devices LD. The scan transistor ST may comprise a gate electrode connected to a scan line (Sk, where k is an integer satisfying $1 \leq k \leq n$), a source electrode connected to the gate electrode of the driving transistor DT, and a drain electrode connected to a data line (Dj, where j is an integer satisfying $1 \leq j \leq m$).

The capacitor Cst is formed between the gate electrode and the source electrode of the driving transistor DT. The storage capacitor Cst charges the difference between the gate voltage and the source voltage of the driving transistor DT.

The driving transistor DT and the scan transistor ST may be formed as thin film transistors. In addition, in FIG. 3, the driving transistor DT and the scan transistor ST are described mainly as being formed as P-type metal oxide semiconductor field effect transistors (MOSFETs), but the present invention is not limited thereto. The driving transistor DT and the scan transistor ST may also be formed as N-type MOSFETs. In this case, the positions of the source electrode and the drain electrode of each of the driving transistor DT and the scan transistor STs may be changed.

In addition, although FIG. 3 illustrates that each of the first sub-pixel PX1, the second sub-pixel PX2, and the third sub-pixel PX3 comprises a 2T1C (2 Transistor-1 capacitor) having one driving transistor DT, one scan transistor ST, and one capacitor Cst, but the present invention is not limited thereto. Each of the first sub-pixel PX1, the second sub-pixel PX2, and the third sub-pixel PX3 may comprise a plurality of scan transistors STs and a plurality of capacitors Csts.

Since the second sub-pixel PX2 and the third sub-pixel PX3 may be expressed by substantially the same circuit diagram as the first sub-pixel PX1, a detailed description thereof will be omitted.

The driving circuit 20 outputs signals and voltages for driving the display panel 10. For this purpose, the driving circuit 20 may comprise a data driving circuit 21 and a timing controller 22.

The data driving circuit 21 receives digital video data DATA and a source control signal DCS from the timing controller 22. The data driving circuit 21 converts digital video data DATA into analog data voltages according to the source control signal DCS and supplies the converted data to data lines D1 to Dm of the display panel 10.

The timing controller 22 receives digital video data DATA and timing signals from the host system. The timing signals may comprise a vertical sync signal, a horizontal sync signal, a data enable signal, and a dot clock. The host system may be an application processor of a smartphone or tablet PC, a monitor, a system on chip of a TV, etc.

The timing controller 22 generates control signals for controlling the operation timing of the data driving circuit 21 and the scan driving circuit 30. The control signals may comprise a source control signal DCS for controlling the operation timing of the data driving circuit 21 and a scan control signal SCS for controlling the operation timing of the scan driving circuit 30.

The driving circuit 20 may be disposed in a non-display area NDA provided on one side of the display panel 10. The driving circuit 20 may be formed as an integrated circuit (IC) and mounted on the display panel 10 in a chip on glass (COG) manner, a chip on plastic (COP) manner, or an ultrasonic bonding manner, but the present invention is not limited thereto. For example, the driving circuit 20 may be mounted on a circuit board (not shown) other than the display panel 10.

The data driving circuit 21 may be mounted on the display panel 10 in a COG manner, a COP manner, or an ultrasonic bonding manner, and the timing controller 22 may be mounted on the circuit board.

The scan driving circuit 30 receives a scan control signal SCS from the timing controller 22. The scan driving circuit 30 generates scan signals according to the scan control signal SCS and supplies them to the scan lines S1 to Sn of the display panel 10. The scan driving circuit 30 may comprise a plurality of transistors and may be formed in a non-display area NDA of the display panel 10. Alternatively, the scan driving circuit 30 may be formed as an integrated circuit, in which case it may be mounted on a gate flexible film attached to the other side of the display panel 10.

The circuit board may be attached to pads provided on an edge of one side of the display panel 10 using an anisotropic conductive film. As a result, lead lines of the circuit board may be electrically connected to the pads. The circuit board may be a flexible film, such as a flexible printed circuit board, a printed circuit board, or a chip on film. The circuit board may be bent to the bottom of the display panel 10. As a result, one side of the circuit board may be attached to an edge of one side of the display panel 10, and the other side may be disposed on the bottom of the display panel 10 and connected to a system board on which a host system is mounted.

The power supply circuit 50 can generate voltages required for driving the display panel 10 from the main power applied from the system board and supply them to the display panel 10. For example, the power supply circuit 50 can generate a high-potential voltage VDD and a low-potential voltage VSS for driving the light-emitting devices LDs of the display panel 10 from the main power and supply them to the high-potential voltage line VDDL and the low-potential voltage line VSSL of the display panel 10. In addition, the power supply circuit 50 can generate and supply driving voltages for driving the driving circuit 20 and the scan driving circuit 30 from the main power.

Figure 4:
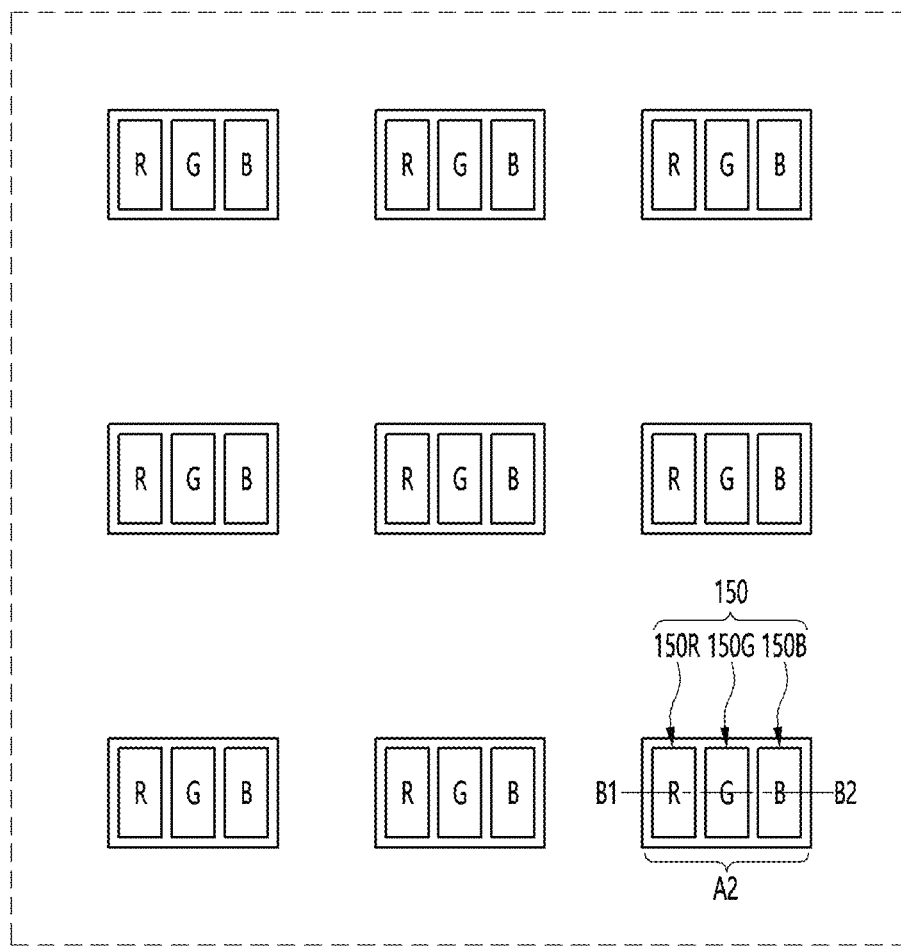
FIG. 4 is an enlarged view of a first panel area of the display device of FIG. 1.

FIG. 4 is an enlarged view of the first panel area in the display device of FIG. 3.

Referring to FIG. 4, the display device 100 of the embodiment can be manufactured by mechanically and electrically connecting a plurality of panel areas, such as the first panel area A1, by tiling.

The first panel area A1 may comprise a plurality of semiconductor light-emitting devices 150 disposed for each unit pixel (PX of FIG. 2).

For example, the unit pixel PX may comprise a first sub-pixel PX1, a second sub-pixel PX2, and a third sub-pixel PX3. For example, a plurality of red semiconductor light-emitting devices 150R may be disposed in the first sub-pixel PX1, a plurality of green semiconductor light-emitting devices 150G may be disposed in the second sub-pixel PX2, and a plurality of blue semiconductor light-emitting devices 150B may be disposed in the third sub-pixel PX3. The unit pixel PX may further comprise a fourth sub-pixel in which no semiconductor light-emitting devices are disposed, but is not limited thereto.

Figure 5:
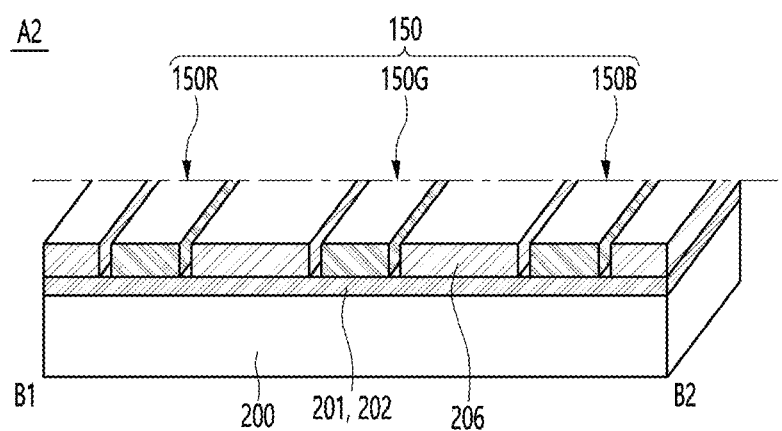
FIG. 5 is an enlarged view of the A2 area of FIG. 4.

FIG. 5 is an enlarged view of the A2 area of FIG. 4.

Referring to FIG. 5, the display device 100 of the embodiment may comprise a substrate 200, assembling wirings 201 and 202, an insulating layer 206, and a plurality of semiconductor light-emitting devices 150. More components may be included.

The assembling wiring may comprise a first assembling wiring 201 and a second assembling wiring 202 that are spaced apart from each other. The first assembling wiring 201 and the second assembling wiring 202 may be provided to generate a dielectrophoretic force for assembling the semiconductor light-emitting device 150. For example, the semiconductor light-emitting device 150 may be one of a lateral-type semiconductor light-emitting device, a flip-chip type semiconductor light-emitting device, and a vertical-type semiconductor light-emitting device.

The semiconductor light-emitting device 150 may comprise, but is not limited to, a red semiconductor light-emitting device 150, a green semiconductor light-emitting device 150G, and a blue semiconductor light-emitting device 150B to form a unit pixel (sub-pixel), and may also comprise a red phosphor and a green phosphor to implement red and green, respectively.

The substrate 200 may be a support member that supports components disposed on the substrate 200 or a protective member that protects the components.

The substrate 200 may be a rigid substrate or a flexible substrate. The substrate 200 may be formed of sapphire, glass, silicon, or polyimide. In addition, the substrate 200 may comprise a flexible material such as polyethylene naphthalate (PEN), polyethylene terephthalate (PET). In addition, the substrate 200 may be a transparent material, but is not limited thereto.

The substrate 200 may be a backplane equipped with circuits, such as transistors ST and DT, capacitors Cst, signal wiring, etc., within the sub-pixels PX1, PX2, and PX3 illustrated in FIGS. 2 and 3, but is not limited thereto.

The insulating layer 206 may comprise an organic material having insulation and flexibility, such as polyimide, PAC, PEN, PET, polymer, etc., or an inorganic material, such as silicon oxide ($SiO_2$) or silicon nitride series ($SiN_x$), and may be formed integrally with the substrate 200 to form a single substrate.

The insulating layer 206 may be a conductive adhesive layer having adhesiveness and conductivity, and the conductive adhesive layer may have flexibility to enable a flexible function of the display device. For example, the insulating layer 206 may be a conductive adhesive layer, such as an anisotropic conductive film (ACF), an anisotropic conductive medium, a solution containing conductive particles, etc. The conductive adhesive layer may be a layer that is electrically conductive in a vertical direction relative to the thickness, or electrically insulating in a horizontal direction relative to the thickness.

The insulating layer 206 may comprise an assembly hole 203 for inserting the semiconductor light-emitting device 150. Therefore, during self-assembly, the semiconductor light-emitting device 150 may be easily inserted into the assembly hole 203 of the insulating layer 206. The assembly hole 203 may be called an insertion hole, a fixing hole, an alignment hole, etc.

The assembly hole 203 may be called a hole, a groove, a recess, a pocket, etc.

The assembly hole 203 may be different depending on the shape of the semiconductor light-emitting device 150. For example, the red semiconductor light-emitting device, the green semiconductor light-emitting device, and the blue semiconductor light-emitting device each have different shapes, and may have an assembly hole 203 having a shape corresponding to the shape of each of these semiconductor light-emitting devices. For example, the assembly hole 203 may comprise a first assembly hole for assembling the red semiconductor light-emitting device, a second assembly hole for assembling the green semiconductor light-emitting device, and a third assembly hole for assembling the blue semiconductor light-emitting device. For example, the red semiconductor light-emitting device may have a circular shape, the green semiconductor light-emitting device may have a first oval shape having a first minor axis and a first major axis, and the blue semiconductor light-emitting device may have a second oval shape having a second minor axis and a second major axis, but is not limited thereto. The second major axis of the oval shape of the blue semiconductor light-emitting device may be larger than the second major axis of the oval shape of the green semiconductor light-emitting device, and the second minor axis of the oval shape of the blue semiconductor light-emitting device may be smaller than the first minor axis of the oval shape of the green semiconductor light-emitting device.

Meanwhile, the method of mounting the semiconductor light-emitting device 150 on the substrate 200 may comprise, for example, a self-assembly method (FIG. 6) and a transfer method.

Figure 6:
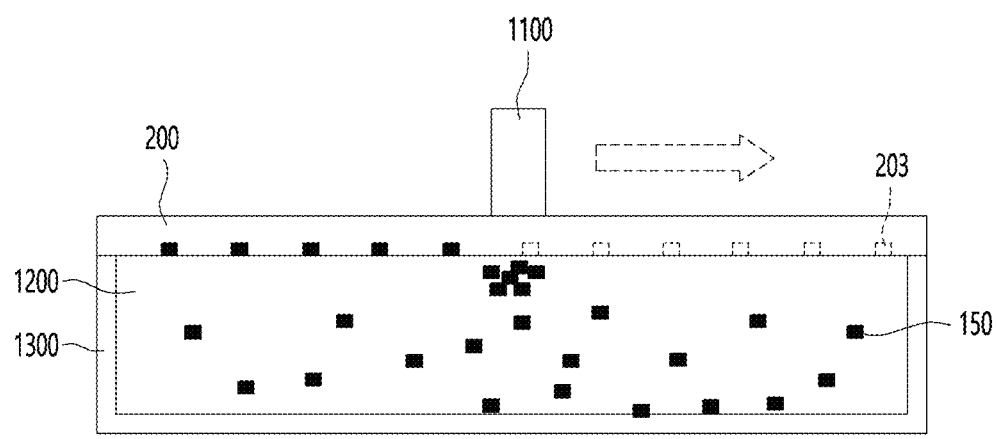
FIG. 6 is a drawing showing an example in which a light-emitting device according to an embodiment is assembled on a substrate by a self-assembly method.

FIG. 6 is a drawing showing an example in which a semiconductor light-emitting device according to an embodiment is assembled on a substrate by a self-assembly method.

The self-assembly method of the semiconductor light-emitting device will be described with reference to FIGS. 5 and 6.

The substrate 200 may be a panel substrate of a display device. In the following description, the substrate 200 is described as a panel substrate of a display device, but the embodiment is not limited thereto.

The substrate 200 may be formed of glass or polyimide. In addition, the substrate 200 may comprise a flexible material such as polyethylene naphthalate (PEN) or polyethylene terephthalate (PET). In addition, the substrate 200 may be a transparent material, but is not limited thereto.

Referring to FIG. 6, the semiconductor light-emitting device 150 may be put into a chamber 1300 filled with a fluid 1200. The fluid 1200 may be water, such as ultrapure water, but is not limited thereto. The chamber may be called a tank, a container, a vessel, etc.

Thereafter, the substrate 200 may be disposed on the chamber 1300. According to an embodiment, the substrate 200 may be putted into the chamber 1300.

As illustrated in FIG. 5, a pair of assembling wirings 201 and 202 corresponding to each of the semiconductor light-emitting devices 150 to be assembled may be disposed on the substrate 200.

The assembling wirings 201 and 202 may be formed of a transparent electrode (ITO) or may comprise a metal material having excellent electrical conductivity. For example, the assembling wiring 201 and 202 may be formed of at least one of titanium (Ti), chromium (Cr), nickel (Ni), aluminum (Al), platinum (Pt), gold (Au), tungsten (W), and molybdenum (Mo), or an alloy thereof.

The assembling wiring 201 and 202 may form an electric field by an externally-supplied voltage, and a dielectrophoretic force may be formed between the assembling wiring 201 and 202 by the electric field. The semiconductor light-emitting device 150 may be fixed to the assembly hole 203 on the substrate 200 by the dielectrophoretic force.

The gap between the assembling wiring 201 and 202 may be formed smaller than the width of the semiconductor light-emitting device 150 and the width of the assembly hole 203, so that the assembly position of the semiconductor light-emitting device 150 may be fixed more precisely using the electric field.

An insulating layer 206 is formed on the assembling wiring 201 and 202 to protect the assembling wiring 201 and 202 from the fluid 1200 and prevent leakage of current flowing through the assembling wiring 201 and 202. The insulating layer 206 may be formed as a single layer or multiple layers of an inorganic insulator such as silica or alumina or an organic insulator.

In addition, the insulating layer 206 may comprise an insulating and flexible material such as polyimide, PEN, PET, etc., and may be formed integrally with the substrate 200 to form a single substrate.

The insulating layer 206 may be an adhesive insulating layer or a conductive adhesive layer having conductivity. The insulating layer 206 may be flexible and enable a flexible function of the display device.

The insulating layer 206 may have a partition wall, and an assembly hole 203 may be formed by the partition wall. For example, when forming the substrate 200, a part of the insulating layer 206 is removed, so that each of the semiconductor light-emitting devices 150 can be assembled into the assembly hole 203 of the insulating layer 206.

An assembly hole 203 is formed in the substrate 200, where the semiconductor light-emitting devices 150 are combined, and a surface where the assembly hole 203 is formed can be in contact with a fluid 1200. The assembly hole 203 can guide the exact assembly position of the semiconductor light-emitting device 150.

Meanwhile, the assembly hole 203 can have a shape and size corresponding to the shape of the semiconductor light-emitting device 150 to be assembled at the corresponding position. Accordingly, it is possible to prevent another semiconductor light-emitting device from being assembled into the assembly hole 203 or a plurality of semiconductor light-emitting devices from being assembled.

Referring again to FIG. 6, after the substrate 200 is disposed, an assembly device 1100 comprising a magnetic body can move along the substrate 200. For example, a magnet or an electromagnet may be used as the magnetic body. The assembly device 1100 may move in contact with the substrate 200 to maximize the area affected by the magnetic field within the fluid 1200. Depending on the embodiment, the assembly device 1100 may comprise a plurality of magnetic bodies or may comprise a magnetic body of a size corresponding to the substrate 200. In this case, the movement distance of the assembly device 1100 may be limited within a predetermined range.

The semiconductor light-emitting devices 150 within the chamber 1300 may move toward the assembly device 1100 by the magnetic field generated by the assembly device 1100.

The semiconductor light-emitting devices 150 may enter the assembly hole 203 and come into contact with the substrate 200 while moving toward the assembly device 1100.

At this time, the semiconductor light-emitting devices 150 in contact with the substrate 200 can be prevented from being detached by the movement of the assembly device 1100 by the electric field applied by the assembling wiring 201 and 202 formed on the substrate 200.

That is, by the self-assembly method using the above-described electromagnetic field, the time required for each of the semiconductor light-emitting devices 150 to be assembled on the substrate 200 can be drastically shortened, so that a large-area, high-pixel display can be implemented more quickly and economically.

A predetermined solder layer (not shown) is further formed between the semiconductor light-emitting device 150 assembled on the assembly hole 203 of the substrate 200 and the substrate 200 to improve the bonding strength of the semiconductor light-emitting device 150.

Thereafter, the electrode wiring (not shown) is connected to the semiconductor light-emitting device 150 so that power can be applied.

Next, although not shown, at least one or more insulating layer may be formed by a post-process. The at least one or more insulating layer may be a transparent resin or a resin containing a reflective material or a scattering material.

Meanwhile, the embodiment relates to a display device having a sensing function.

According to the embodiment, when implementing an image by the first color light of the first semiconductor light-emitting device, the second color light of the second semiconductor light-emitting device, and the third color light of the third semiconductor light-emitting device for each pixel, various sensors, i.e., an external light-sensitive sensor, a proximity sensor, a touch sensor, and a fingerprint sensor, can be implemented by using a semiconductor light-emitting device having a light-receiving function by a power source with reverse bias as a sensing element to detect a sensing signal corresponding to internal light or external light. The internal light may be the first color light, the second color light, and the third color light. The external light may be the sun, light from a light source, light from a street lamp, etc.

The omitted description below can be easily understood from the descriptions given above with respect to FIGS. 1 to 6 and the corresponding drawings.

Figure 7:
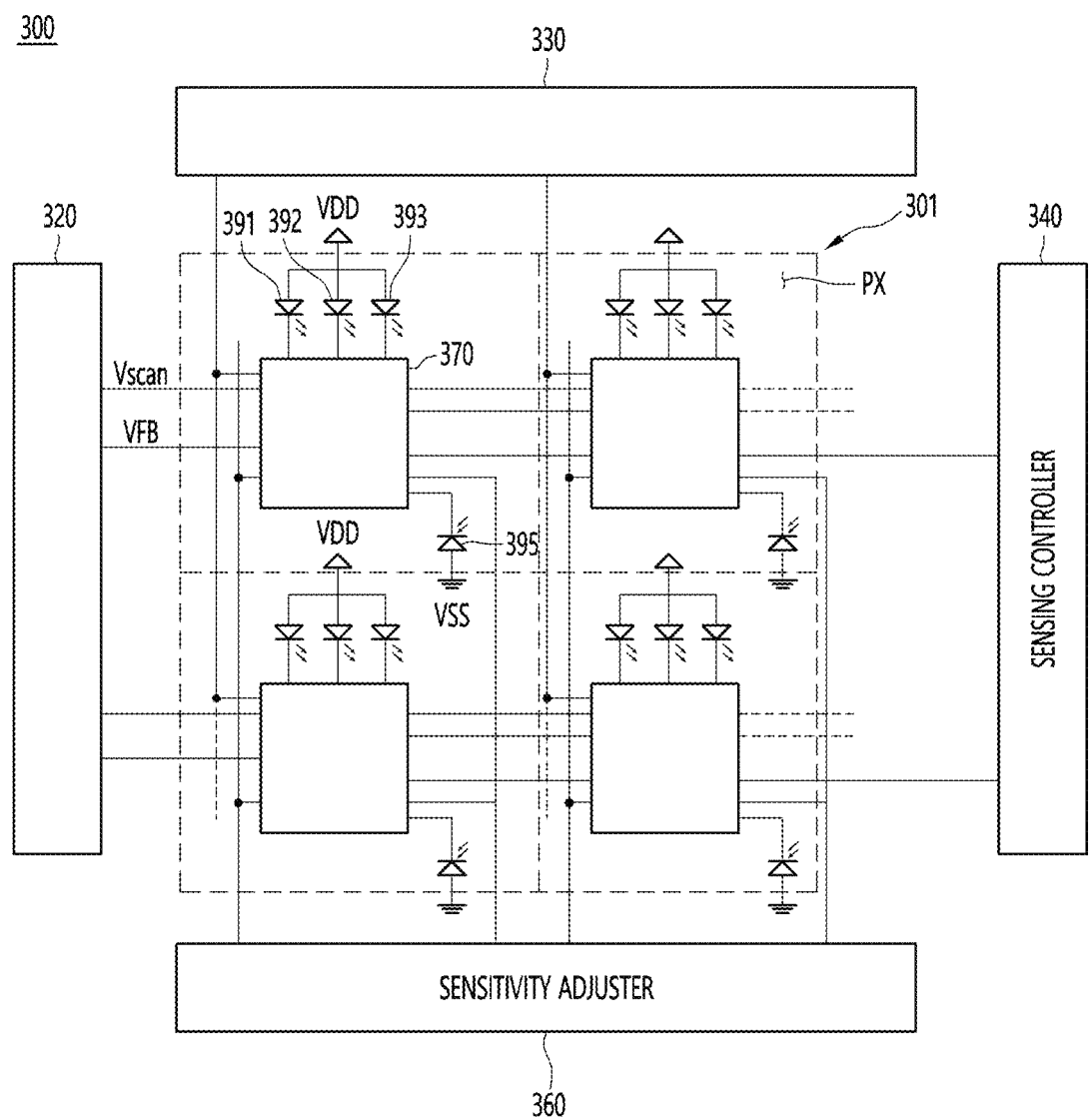
FIG. 7 is a block diagram showing a display device according to an embodiment.
Figure 8:
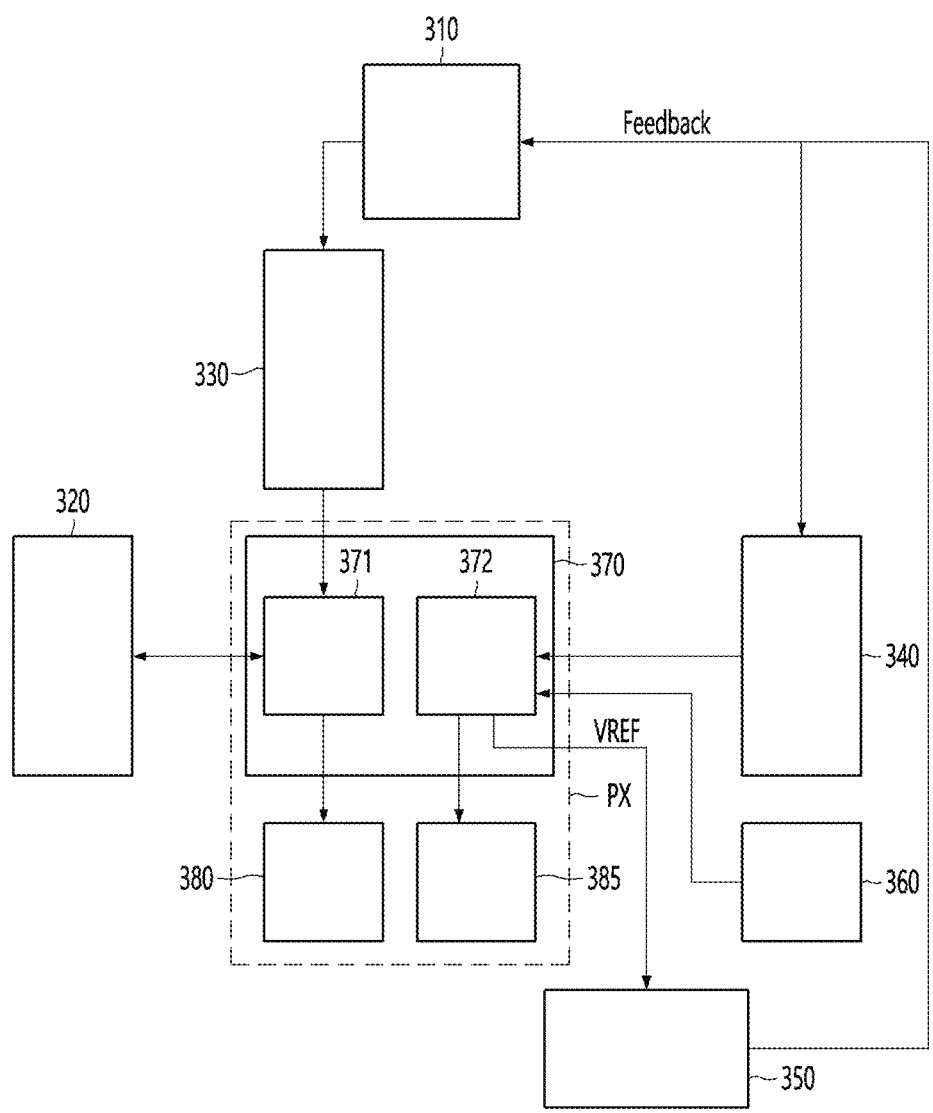
FIG. 8 is a block diagram specifically showing a pixel.
Figure 9:
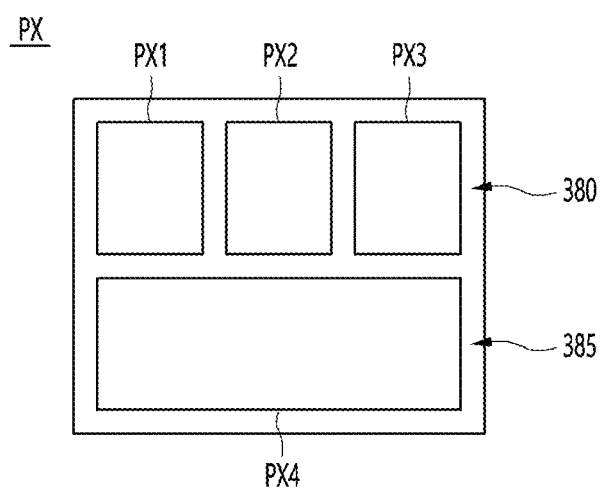
FIG. 9 illustrates a pixel comprising a pixel cell and a sensing cell.

FIG. 7 is a block diagram illustrating a display device according to an embodiment. FIG. 8 is a block diagram specifically illustrating a pixel. FIG. 9 illustrates a pixel comprising a pixel cell and a sensing cell.

Referring to FIGS. 7 to 9, a display device 300 according to an embodiment may comprise a panel 301, a scan driving circuit 320, a data driving circuit 330, and a sensing controller 340.

The scan driving circuit 320 may be the scan driving circuit 30 illustrated in FIG. 2, and the data driving circuit 330 may be the data driving circuit 21 illustrated in FIG. 2.

Pixels PX may be selected for each scan line of the panel 301 by the scan signal VSCAN supplied by the scan driving circuit 320, and an image having a desired luminance can be displayed according to the data voltage supplied by the data driving circuit 330.

A sensing signal can be detected by a sensing control signal supplied by the sensing controller 340. The sensing signal can be a second sensing signal SENSE2, which will be described later.

Meanwhile, the display device 300 according to the embodiment can comprise a sensitivity adjuster 360. The sensitivity adjuster 360 can change a reference value (VREF of FIG. 10) to adjust the sensitivity of the first sensing signal SENSE1. For example, the sensitivity adjuster 360 can obtain a correction value based on the brightness of the image, and change the reference value VREF based on the correction value. The sensitivity adjuster 360 is described in detail with reference to FIG. 13.

As illustrated in FIG. 9, the pixel PX may comprise a pixel cell 380 and a sensing cell 385.

For example, the pixel cell 380 may comprise a first sub-pixel PX1, a second sub-pixel PX2, and a third sub-pixel PX3. The first sub-pixel PX1, the second sub-pixel PX2, and the third sub-pixel PX3 may be positioned adjacent to each other. The first sub-pixel PX1, the second sub-pixel PX2, and the third sub-pixel PX3 may have the same area, but is not limited thereto.

At least one first semiconductor light-emitting device 391 may be disposed in the first sub-pixel PX1, at least one or more second semiconductor light-emitting device 392 may be disposed in the second sub-pixel PX2, and at least one or more third semiconductor light-emitting device 393 may be disposed in the third sub-pixel PX3. For example, the first semiconductor light-emitting device 391 may comprise a red semiconductor light-emitting device that generates red light. For example, the second semiconductor light-emitting device 392 may comprise a green semiconductor light-emitting device that generates green light. For example, the third semiconductor light-emitting device 393 may comprise a blue semiconductor light-emitting device that generates blue light. The red light may be referred to as the first color light, the green light may be referred to as the second color light, and the blue light may be referred to as the third color light.

The first semiconductor light-emitting device 391, the second semiconductor light-emitting device 392, and the third semiconductor light-emitting device 393 may have a size of micrometers or less. For example, the first semiconductor light-emitting device 391, the second semiconductor light-emitting device 392, and the third semiconductor light-emitting device 393 may have a size of nanometers. For example, the first semiconductor light-emitting device 391, the second semiconductor light-emitting device 392, and the third semiconductor light-emitting device 393 may have different shapes when viewed from above. This is to dramatically shorten the process time by simultaneously assembling the first semiconductor light-emitting device 391, the second semiconductor light-emitting device 392, and the third semiconductor light-emitting device 393 through a single self-assembly process, as will be described later.

For example, the sensing cell 385 may comprise at least one or more fourth sub-pixel PX4. The at least one or more sensing element 395, for example, the fourth semiconductor light-emitting device that is the sensing element 395, may be disposed in the sub-pixel PX4 of the sensing cell 385.

In the following description, the sensing element 395 and the fourth semiconductor light-emitting device are considered to be the same, and the fourth semiconductor light-emitting device is referred to as the drawing symbol 395, which is the same as the drawing symbol of the sensing element 395.

The first semiconductor light-emitting device 391, the second semiconductor light-emitting device 392, the third semiconductor light-emitting device 393, and the fourth semiconductor light-emitting device 395 may be formed of a compound semiconductor material. A group III-V compound semiconductor material or a group II-VI compound semiconductor material may be used as the compound semiconductor material.

The first semiconductor light-emitting device 391, the second semiconductor light-emitting device 392, the third semiconductor light-emitting device 393, and the fourth semiconductor light-emitting device 395 may emit light by a power source having a forward bias and receive light by a power source having a reverse bias. That is, the first semiconductor light-emitting device 391, the second semiconductor light-emitting device 392, the third semiconductor light-emitting device 393, and the fourth semiconductor light-emitting device 395 may emit light or receive light depending on the connection of the power supply.

Therefore, the fourth semiconductor light-emitting device, i.e., the sensing element 395, may be a photo diode, a photo detector, a photo sensor, or a photo receiver.

For example, the fourth semiconductor light-emitting device 395 may generate color light identical to the color light of a specific wavelength band of one semiconductor light-emitting device among the first semiconductor light-emitting device 391, the second semiconductor light-emitting device 392, and the third semiconductor light-emitting device 393. For example, when two second semiconductor light-emitting devices 392 are provided, one of the second semiconductor light-emitting devices 392 may be disposed in the second sub-pixel PX2 of the pixel cell 380 as a semiconductor light-emitting device for luminescence, and the other second semiconductor light-emitting device 392 may be disposed in the sub-pixel of the sensing cell 385 as a semiconductor light-emitting device for light reception.

According to the embodiment, the first semiconductor light-emitting device 391, the second semiconductor light-emitting device 392, and the third semiconductor light-emitting device 393 can be disposed in the first sub-pixel PX1, the second sub-pixel PX2, and the third sub-pixel PX3 of the pixel cell 380, respectively, and can be electrically connected so that power having a forward bias is applied, so that red light, the green light, and the blue light can be generated by the power having a forward bias.

According to the embodiment, the fourth semiconductor light-emitting device 395 can be disposed in the sub-pixel of the sensing cell 385, and can be electrically connected so that power having a reverse bias is applied, and can be light-received by the power having a reverse bias to output the first sensing signal SENSE1.

Meanwhile, as illustrated in FIG. 8, the pixel PX may comprise a circuit block 370. That is, the circuit block 370 may be disposed in the pixel PX.

The circuit block 370 may be built in the substrate or disposed on the substrate as an integrated circuit (IC), as will be described later. For example, the circuit block 370 may be formed on the substrate using a semiconductor process. For example, the circuit block 370 may be mounted on the substrate as a component that is an integrated circuit.

For example, the circuit block 370 may have a size of micrometers or less.

The circuit block 370 can control each of display cells and sensing cells 385. For example, circuit block 370 can comprise first circuit block 371 and second circuit block 372.

For example, the first circuit block 371 can control light emission of each of first semiconductor light-emitting device 391, the second semiconductor light-emitting device 392 and the third semiconductor light-emitting device 393 disposed in each of first sub-pixel PX1, the second sub-pixel PX2 and the third sub-pixel PX3 of the display cell.

For example, the second circuit block 372 can control detection of second sensing signal SENSE2 using the first sensing signal SENSE1 output from the sensing element 395 disposed in the sub-pixel of sensing cell 385, i.e., the fourth semiconductor light-emitting device.

For example, at least one sensing element 395 can be disposed in each of the pixels PX. In this case, sensing is possible in pixel PX units, so that sensing performance can be dramatically improved.

The second sensing signal SENSE2 can be fed back to a processor 310 through a sensing signal receiver 350, and various sensor functions can be implemented by the processor 310.

For example, when an object such as a finger does not come into contact with the panel 301, external light can be received by the light-receiving circuit. For example, when an object such as a finger comes into contact with the panel 301, external light is blocked by the object and is not received by the light-receiving circuit, and internal light can be reflected by the object and received by the light-receiving circuit. For example, when an object such as a finger is located on the panel 301, both external light and internal light can be received by the light-receiving circuit. In this way, since external light and/or internal light are received by the light-receiving circuit depending on the position of the object, various sensing functions can be implemented.

The external light may be the sun, light from a light source, light from a street lamp, etc.

The internal light may be light emitted from the panel 301, for example, a first color light from the first semiconductor light-emitting device 391, a second color light from the second semiconductor light-emitting device 392, and a third color light from the third semiconductor light-emitting device 393. For example, the internal light may be an average intensity value of the intensity of the first color light from the first semiconductor light-emitting device 391, the intensity of the second color light from the second semiconductor light-emitting device 392, and the intensity of the third color light from the third semiconductor light-emitting device 393, but is not limited thereto.

The internal light may be called reflected light because the light emitted from the panel 301 is reflected by an object such as a finger and received by a sensing circuit.

The external light may be called first light, and the internal light may be called second light.

Figure 18:
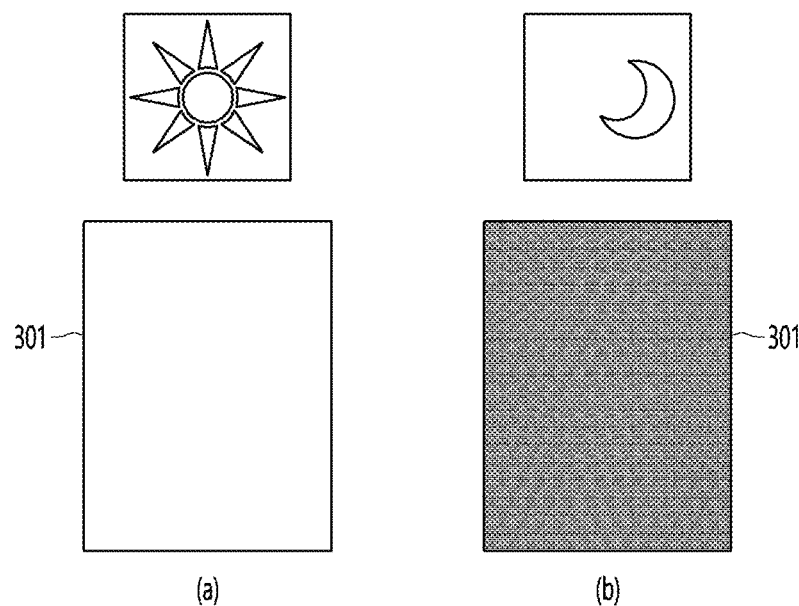
FIGS. 18 to 21 show various sensors that can be implemented in a display device according to an embodiment.

As a first example, the brightness of the panel 301 can be adjusted according to conditions of the external light (FIG. 18). At this time, the sensing circuit may be an external light sensitive sensor.

For example, as illustrated in FIG. 18(*a*), when sunlight shines during the day, the brightness of the panel 301 can be adjusted to be brighter. For example, as illustrated in FIG. 18(*b*), when there is no sunlight at night, the brightness of the panel 301 can be adjusted to be darker. The sensing circuit may receive internal light and external light.

Since the external light is detected by the light-receiving circuit when the finger does not touch the panel 301, the intensity (or brightness) of the external light may vary depending on the day and night, and the brightness of the panel 301 may be adjusted according to the intensity of the external light.

Figure 19:
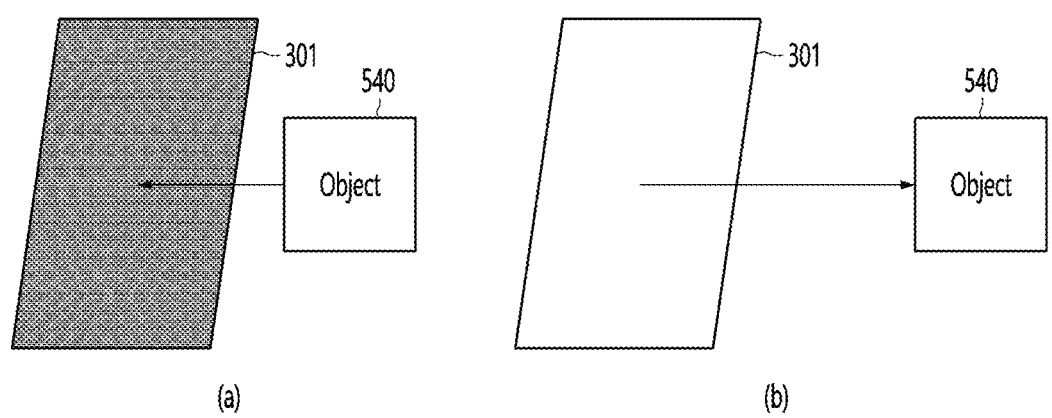

As a second example, the brightness of the panel 301 may be adjusted according to the proximity of the object 540 (FIG. 19). At this time, the sensing circuit may be a proximity sensor.

For example, as illustrated in FIG. 19(*a*), when the object 540 approaches the panel 301, the external light may be blocked by the object 540, so that the external light cannot be detected by the sensing circuit. In this case, the brightness of the panel 301 may be adjusted to be darker. For example, as illustrated in FIG. 19(*b*), when the object 540 moves away from the panel 301, the external light may be not blocked by the object 540, so that the ambient light can be detected by the sensing circuit. In this case, the brightness of the panel 301 may be adjusted to be brighter. That is, the brightness of the panel 301 may be adjusted according to the degree of proximity of the object 540 to the panel 301.

Figure 20:
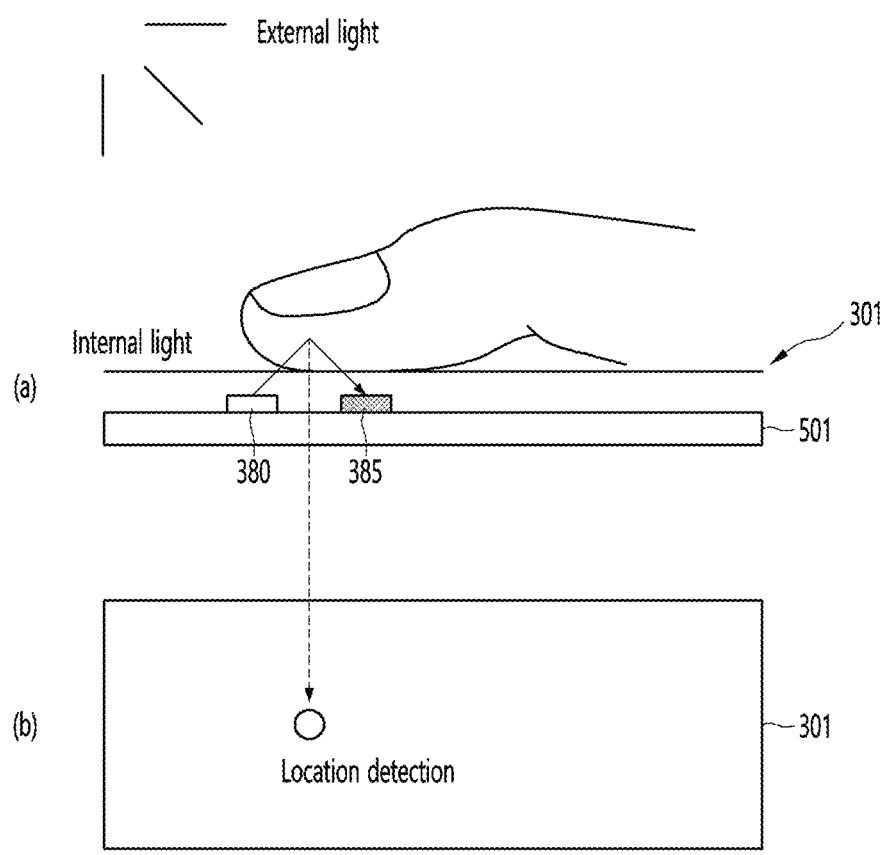

As a third example, when a finger touches a specific area on the panel 301, the external light may be detected by the sensing circuit by the finger. At this time, the sensing circuit may be a touch sensor. In this case, since the internal light is detected by the sensing circuit as illustrated in FIG. 20(*a*), as shown in FIG. 20(*b*), whether a specific area on the panel 301 is touched can be determined based on the sensing signal (the first sensing signal SENSE1, the second sensing signal SENSE2) corresponding to the internal light detected by the sensing circuit.

Figure 21:
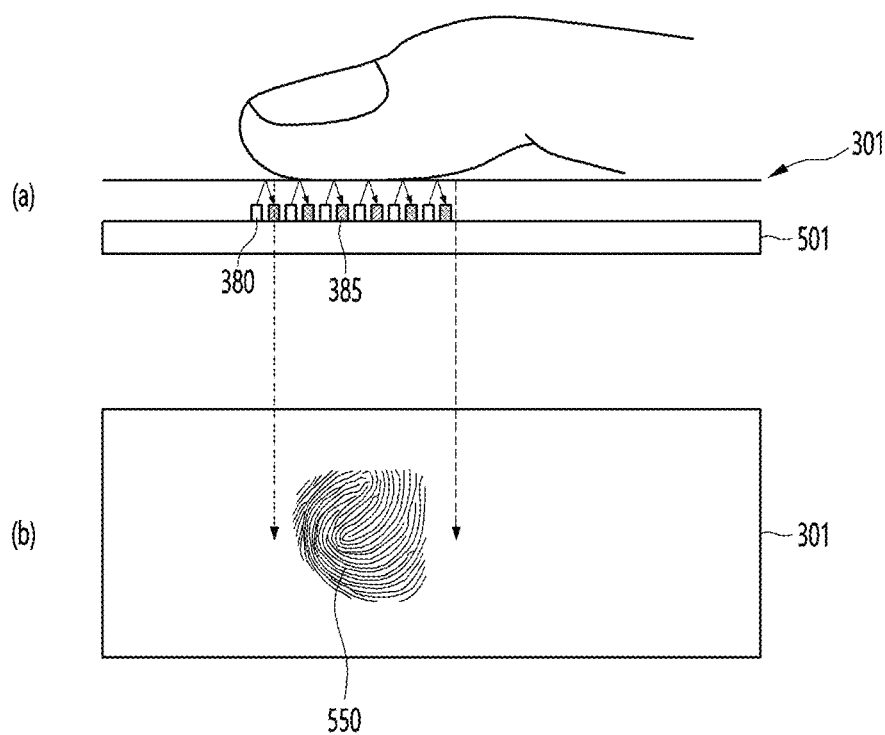

As a fourth example, when a finger touches the panel 301 over a wider area than in the third example, external light can be detected by the sensing circuit by the finger. At this time, the sensing circuit can be a fingerprint sensor. In this case, as illustrated in FIG. 21(*a*), the internal light of each of the plurality of pixels PX corresponding to the area where the finger has come into contact may be detected as a sensing signal by the sensing circuit of each of the plurality of pixels PX, and as illustrated in FIG. 21(*b*), a fingerprint image 550 can be obtained based on the sensing signals detected in each of the plurality of pixels PX.

Figure 10:
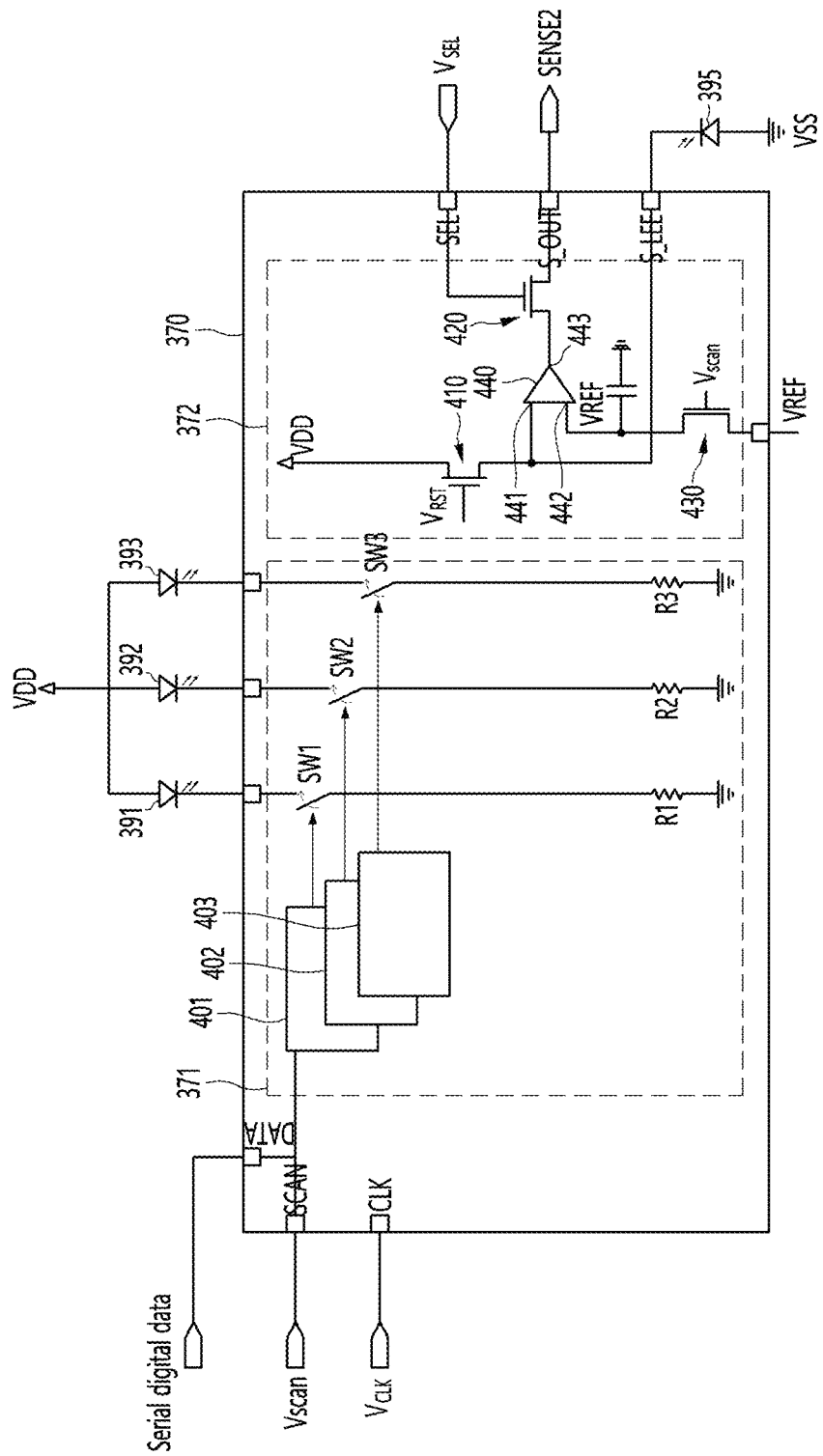
FIG. 10 is a circuit diagram illustrating a circuit block of a pixel.

FIG. 10 is a circuit diagram illustrating a circuit block of a pixel.

Referring to FIG. 10, the circuit block 370 may comprise a first circuit block 371 and a second circuit block 372.

As described above, the first circuit block 371 can control the light emission of each of the first semiconductor light-emitting device 391, the second semiconductor light-emitting device 392, and the third semiconductor light-emitting device 393 disposed in each of the first sub-pixel PX1, the second sub-pixel PX2, and the third sub-pixel PX3 of the display cell. In addition, the second circuit block 372 can control the detection of the second sensing signal SENSE2 using the first sensing signal SENSE1 output from the sensing element 395 disposed in the sub-pixel of the sensing cell 385, that is, the fourth semiconductor light-emitting device. For example, the second sensing signal SENSE2 can be detected by considering the sensitivity of the first sensing signal SENSE1. To this end, as will be described later, the reference value VREF can be changed in the sensitivity adjuster 360 by considering the intensity of the internal light, that is, the brightness of the image, and the second sensing signal SENSE2 can be detected by comparing the changed reference value VREF with the first sensing signal SENSE1.

Meanwhile, the first circuit block 371 can comprise a plurality of pulse generators 401, 402, and 403 and a plurality of switches SW1, SW2, and SW3.

For example, a first switch SW1 may be electrically connected to a first semiconductor light-emitting device 391, a second switch SW2 may be electrically connected to a second semiconductor light-emitting device 392, and a third switch SW3 may be electrically connected to a third semiconductor light-emitting device 393. A first resistor R1 may be electrically connected between the first switch SW1 and ground, a second resistor R2 may be electrically connected between the second switch SW2 and ground, and a third resistor R3 may be electrically connected between the third switch SW3 and ground. Each of the first resistor R1, the second resistor R2, and the third resistor R3 may prevent a sudden current from flowing through the first semiconductor light-emitting device 391, the second semiconductor light-emitting device, and the third semiconductor light-emitting device 393, respectively.

The first switch SW1 can control the emission of the first color light of the first semiconductor light-emitting device 391, the second switch SW2 can control the emission of the second color light of the second semiconductor light-emitting device 392, and the third switch W3 can control the emission of the third color light of the third semiconductor light-emitting device 393.

For example, when the first switch SW1 is turned on, current can flow through the first semiconductor light-emitting device 391, the first switch SW1, so that the first resistor, and the first color light, for example, the red light, having an intensity (or brightness) corresponding to the current can be generated from the first semiconductor light-emitting device 391. For example, when the first switch SW1 is turned off, current does not flow through the first semiconductor light-emitting device 391, the first switch SW1, and the first resistor, and therefore, the first color light may be not generated from the first semiconductor light-emitting device 391. For example, when the second switch SW2 is turned on, current can flow through the second semiconductor light-emitting device 392, the second switch SW2, and the second resistor, so that the second color light, for example, the green light, having an intensity (or brightness) corresponding to the current can be generated from the second semiconductor light-emitting device 392. For example, when the second switch SW2 is turned off, current does not flow through the second semiconductor light-emitting device 392, the second switch SW2, and the second resistor, so that second color light may be not generated from the second semiconductor light-emitting device 392. For example, when the third switch SW3 is turned on, current can flow through the third semiconductor light-emitting device 393, the third switch SW3, and the third resistor, so that the third color light having an intensity (or brightness) corresponding to the current can be generated from the third semiconductor light-emitting device 393. For example, when the third switch SW3 is turned off, current does not flow through the third semiconductor light-emitting device 393, the third switch SW3, and the third resistor, so that the third color light may be not generated from the third semiconductor light-emitting device 393.

Therefore, each of the first switch SW1, the second switch SW2, and the third switch SW3 can control the emission time of the first color light of the first semiconductor light-emitting device 391, the emission time of the second color light of the second semiconductor light-emitting device 392, and the emission time of the third color light of the third semiconductor light-emitting device 393.

For example, each of the first switch SW1, the second switch SW2, and the third switch SW3 can be turned on and off for each frame. For example, each of the first switch SW1, the second switch SW2, and the third switch SW3 can have a turn-on section in which the turn-on state is maintained for each frame. The turn-on section can be called an emission section.

Each of the first switch SW1, the second switch SW2, and the third switch SW3 can be controlled by a first pulse generator 401, a second pulse generator 402, and a third pulse generator 403.

For example, the first switch SW1 can be turned on or off by the first emission control signal $V_{PWM\_R}$ of the first pulse generator 401. For example, the second switch SW2 can be turned on or off by the second emission control signal $V_{PWM\_G}$ of the second pulse generator 402. For example, the third switch SW3 can be turned on or off by the third emission control signal $V_{PWM\_B}$ of the third pulse generator 403.

Each of the first pulse generator 401, the second pulse generator 402, and the third pulse generator 403 can output a first emission control signal $V_{PWM\_R}$, a second emission control signal $V_{PWM\_G}$, and a third emission control signal $V_{PWM\_B}$ having a high level, which can turn on each of the first switch SW1, the second switch SW2, and the third switch SW3 during a specific section, i.e., an emission section, of each frame.

Each of the first pulse generator 401, the second pulse generator 402, and the third pulse generator 403 can output a high level signal during the emission section of each frame based on a scan signal $V_{SCAN}$ and serial digital data.

Meanwhile, the second circuit block 372 can comprise a comparator 440, a first switch 410, a second switch 420, and a third switch 430.

The comparator 440 may comprise a first input terminal 441 for inputting a first sensing signal SENSE1, a second input terminal 442 for inputting a reference value VREF, and an output terminal 443 for outputting a second sensing signal SENSE2. The comparator 440 may output a second sensing signal SENSE2 based on the first sensing signal SENSE1 input to the first input terminal 441 and the reference value VREF input to the second input terminal 442.

The first switch 410 may be electrically connected to the first input terminal 441 of the comparator 440 and the sensing element 395, so that the first switch 410 may control power having a reverse bias to be applied to the sensing element 395, i.e., the fourth semiconductor light-emitting device. Accordingly, the fourth semiconductor light-emitting device 395 may have a light-receiving function activated, and may receive external light or ambient light to output the first sensing signal SENSE1. In this case, the first sensing signal SENSE1 may be input to the first input terminal 441 of the comparator 440. The intensity of the first sensing signal SENSE1 may vary depending on the intensity (or brightness, light quantity, etc.) of the internal light and the ambient light, respectively. For example, the first sensing signal SENSE1 may be an analog signal, but is not limited thereto.

The first switch 410 may be turned on by a start signal $V_{RST}$ having a high level, and when the first switch 410 is turned on, the first sensing signal SENSE1 output from the sensing element 395, i.e., the fourth semiconductor light-emitting device, may be input to the first input terminal 441 of the comparator 440. For example, the start signal $V_{RST}$ may be provided from the sensing controller 340.

The second switch 420 may be electrically connected to the output terminal 443 of the comparator 440 to control the output of the second sensing signal SENSE2.

The second switch 420 may be turned on by the selection signal $V_{SEL}$, and when the second switch 420 is turned on, the second sensing signal SENSE2 can be output from the comparator 440. For example, the selection signal $V_{SEL}$ can be provided from the sensing controller 340. The selection signal $V_{SEL}$ can be called an output control signal.

The third switch 430 may be electrically connected to the second input terminal 442 of the comparator 440, and may control the supply of the reference value VREF. The reference value VREF can be provided from the sensitivity adjuster 360.

The third switch 430 may be turned on by the scan signal $V_{SCAN}$, and when the third switch 430 is turned on, the reference value VREF output from the sensitivity adjuster 360 can be input to the second input terminal 442 of the comparator 440.

For example, the scan signal $V_{SCAN}$ may be generated for each scan line during one frame, but is not limited thereto.

Meanwhile, the second circuit block 372 may comprise a capacitor C. The capacitor C may be connected between the comparator 440 and the third switch 430. For example, the capacitor C may be connected between the second input terminal 442 of the comparator 440 and the third switch 430. The reference value VREF output from the sensitivity adjuster (360 of FIG. 13) may be input to the second input terminal 442 of the comparator 440 through the third switch 430. At this time, since the reference value VREF must be continuously input to the second input terminal 442 of the comparator 440 for a certain period of time, it may be stored in the capacitor C.

Figure 11:
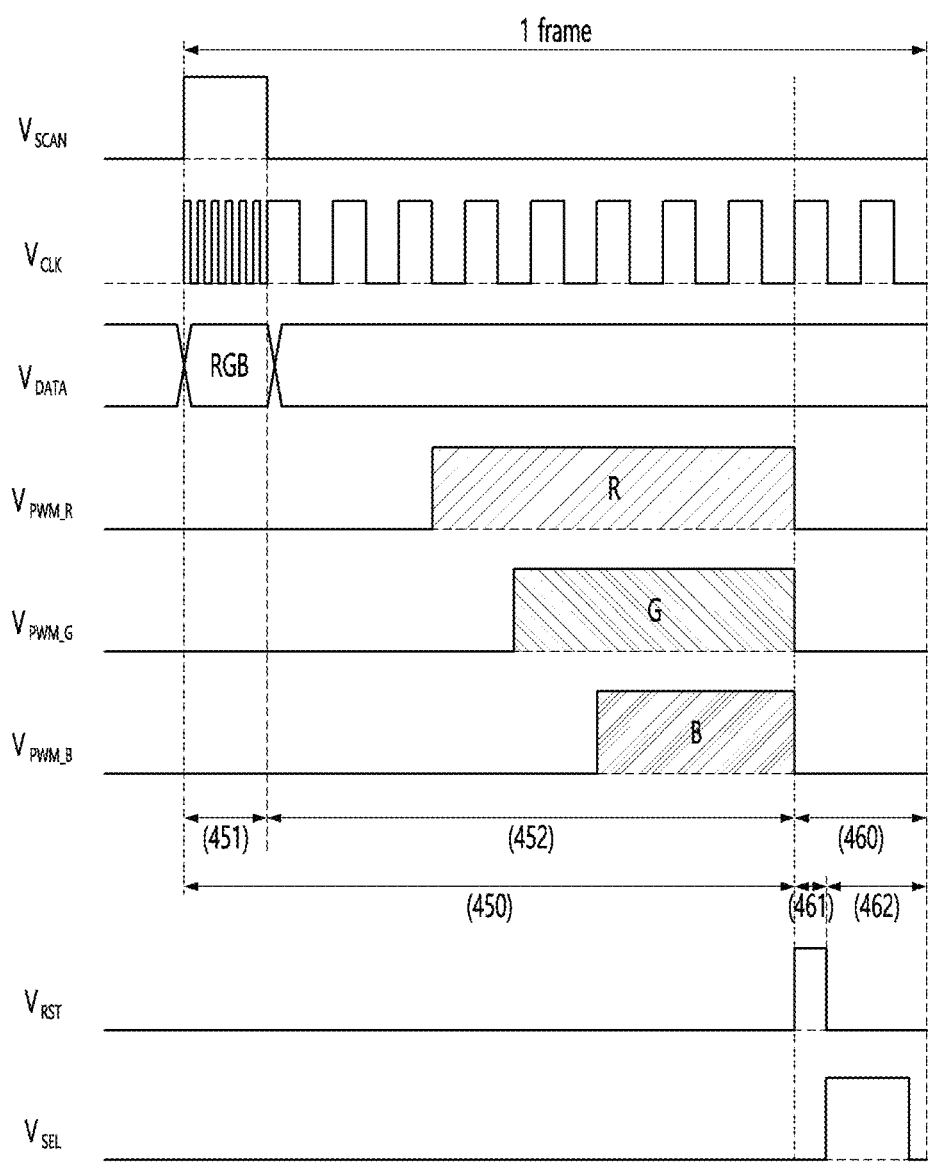
FIG. 11 is an example of a timing diagram.

FIG. 11 is an example of a timing diagram.

As illustrated in FIG. 10 and FIG. 11, an image can be displayed in a frame unit, and the image can be implemented by mixing the first color light of the first semiconductor light-emitting device 391, the second color light of the second semiconductor light-emitting device 392, and the third color light of the third semiconductor light-emitting device 393.

One frame can comprise a first section 450 driven in an emission mode and a second section 460 driven in a sensing mode. In terms of time order, the second section 460 can be after the first section 450. That is, after being driven in the emission mode in the first section 450, it can be driven in the sensing mode in the second section 460.

In the emission mode, the first semiconductor light-emitting device 391, the second semiconductor light-emitting device 392, and the third semiconductor light-emitting device 393 can be driven, respectively, so that the first color light, the second color light, and the third color light can be emitted from the first semiconductor light-emitting device 391, the second semiconductor light-emitting device 392, and the third semiconductor light-emitting device 393, respectively. For example, power having a forward bias can applied to the first semiconductor light-emitting device 391, the second semiconductor light-emitting device 392, and the third semiconductor light-emitting device 393, respectively, so that the first color light, the second color light, and the third color light can be emitted from the first semiconductor light-emitting device 391, the second semiconductor light-emitting device 392, and the third semiconductor light-emitting device 393, respectively.

In the sensing mode, the sensing element 395, i.e., the fourth semiconductor light-emitting device, can be driven, so that a first sensing signal SENSE1 corresponding to external light or internal light can be output from the fourth semiconductor light-emitting device 395. For example, power having a reverse bias can be applied to the fourth semiconductor light-emitting device 395, so that the first sensing signal SENSE1 can be output from the fourth semiconductor light-emitting device 395.

The first section 450 may comprise a first-first section 451 and a first-second section 452.

The first-first section 451 may be a programming section, which is a section for aligning the first digital data, the second digital data, and the third digital data that are sequentially provided according to the serial digital data $V_{DATA}$, when the first digital data, the second digital data, and the third digital data are sequentially provided.

The first-second section 452 may be an emission section, which is a section that causes each of the first semiconductor light-emitting device 391, the second semiconductor light-emitting device 392, and the third semiconductor light-emitting device 393 to emit light.

To this end, the first pulse generator 401, the second pulse generator 402, and the third pulse generator 403 may each generate a first emission control signal $V_{PWM\_R}$, a second emission control signal $V_{PWM\_G}$, and a third emission control signal $V_{PWM\_B}$. Accordingly, the first switch SW1, the second switch SW2, and the third switch SW3 can be turned on by the first emission control signal $V_{PWM\_R}$, the second emission control signal $V_{PWM\_G}$, and the third emission control signal $V_{PWM\_B}$, respectively. In this case, power having a forward bias can be applied to the first semiconductor light-emitting device 391, the second semiconductor light-emitting device 392, and the third semiconductor light-emitting device 393, respectively, so that the first color light, the second color light, and the third color light can be generated from the first semiconductor light-emitting device 391, the second semiconductor light-emitting device 392, and the third semiconductor light-emitting device 393, respectively.

As illustrated in FIG. 11, each of the high-level sections of the first emission control signal $V_{PWM\_R}$, the second emission control signal $V_{PWM\_G}$, and the third emission control signal $V_{PWM\_B}$ can be different from each other. That is, a rising time of the high-level section has the order of the first emission control signal $V_{PWM\_R}$, the second emission control signal $V_{PWM\_G}$, and the third emission control signal $V_{PWM\_B}$, but a falling time may be the same for all of the first emission control signal $V_{PWM\_R}$, the second emission control signal $V_{PWM\_G}$, and the third emission control signal $V_{PWM\_B}$, but is not limited thereto. In this case, the width of the high-level section of the first emission control signal $V_{PWM\_R}$ may be the largest, and the width may decrease in the order of the high-level section of the second emission control signal $V_{PWM\_G}$ and the high-level section of the third emission control signal $V_{PWM\_B}$.

Meanwhile, the second section 460 may comprise a second-first section 461 and a second-second section 462.

The second-first section 461 may be a sensing section, which is be a section in which the sensing element 395, i.e., the fourth semiconductor light-emitting device, is driven to generate the first sensing signal SENSE1.

To this end, a start signal $V_{RST}$ may be generated from the sensing controller 340, and the first switch 410 may be turned on. Accordingly, power having a reverse bias may be applied to the fourth semiconductor light-emitting device 395, and the first sensing signal SENSE1 corresponding to external light or internal light may be generated from the fourth semiconductor light-emitting device 395. The first sensing signal SENSE1 may be input to the first input terminal 441 of the comparator 440.

The second-second section 462 may be an output section, which is a section in which the second sensing signal SENSE2 is output from the comparator 440.

For this purpose, a selection signal $V_{SEL}$ may be generated in the sensing controller 340, and the second switch 420 may be turned on. Accordingly, an output signal of the comparator 440, i.e., a second sensing signal SENSE2, may be output.

For example, the first sensing signal SENSE1 may be compared with a reference value VREF, and the second sensing signal SENSE2 may be output according to the comparison result.

For example, the second sensing signal SENSE2 may be an analog signal. In this case, the second sensing signal SENSE2 may be a difference value between the first sensing signal SENSE1 and the reference value VREF.

For example, the second sensing signal SENSE2 may be a digital signal. In this case, if the first sensing signal SENSE1 is greater than the reference value VREF, the second sensing signal SENSE2 may output "1", and if the first sensing signal SENSE1 is less than the reference value VREF, the second sensing signal SENSE2 may output "0".

Figure 12:
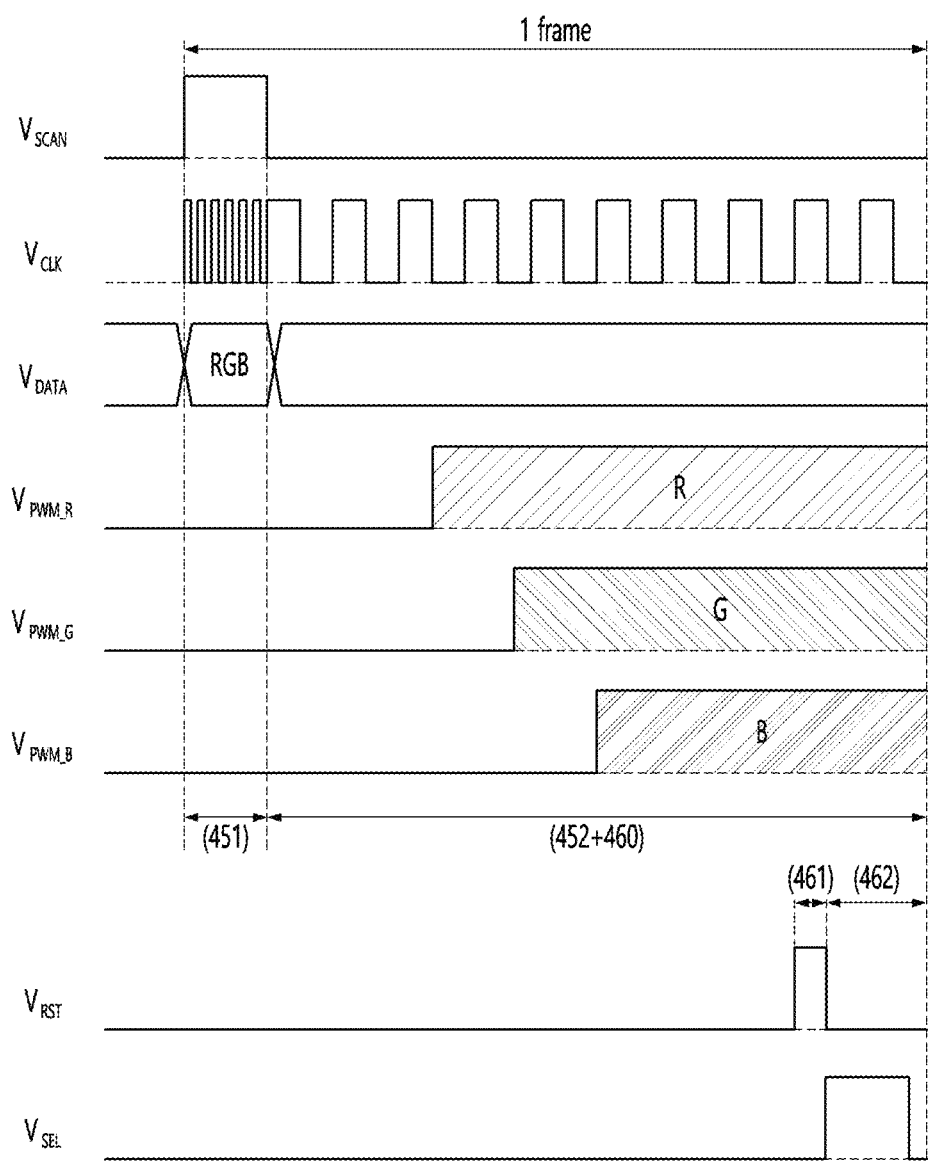
FIG. 12 is another example of a timing diagram.

FIG. 12 is another example of a timing diagram.

As illustrated in FIGS. 10 and 12, an image may be displayed in frame units, and the image may be implemented by mixing the first color light of the first semiconductor light-emitting device 391, the second color light of the second semiconductor light-emitting device 392, and the third color light of the third semiconductor light-emitting device 393.

Unlike FIG. 11, FIG. 12 does not distinguish between the second-first section 461 and the second-second section 462.

For example, it may be driven in the emission mode and the sensing mode during one section of one frame. Here, one section may be the second section 460. That is, during the second section 460, the emission mode and the sensing mode may be driven. For example, during the second section 460, the first semiconductor light-emitting device 391, the second semiconductor light-emitting device 392, and the third semiconductor light-emitting device 393 may each emit light, and the first sensing signal SENSE1 may be generated from the sensing element 395, that is, the fourth semiconductor light-emitting device, and the second sensing signal SENSE2 may be detected based on the first sensing signal SENSE1.

For example, during the second section 460, the time point at which the emission of each of the first semiconductor light-emitting device 391, the second semiconductor light-emitting device 392, and the third semiconductor light-emitting device 393 stops, that is, a falling time, may be the same as the end time point of one frame. At this time, the emission time point of each of the first semiconductor light-emitting device 391, the second semiconductor light-emitting device 392, and the third semiconductor light-emitting device 393 during the second section 460, that is, the rising time, may be different from each other. For example, the emission time point of the first semiconductor light-emitting device 391 may be the fastest, the emission time point of the second semiconductor light-emitting device 392 may be the fastest, and the emission time point of the third semiconductor light-emitting device 393 may be the latest, but is not limited thereto.

Figure 13:
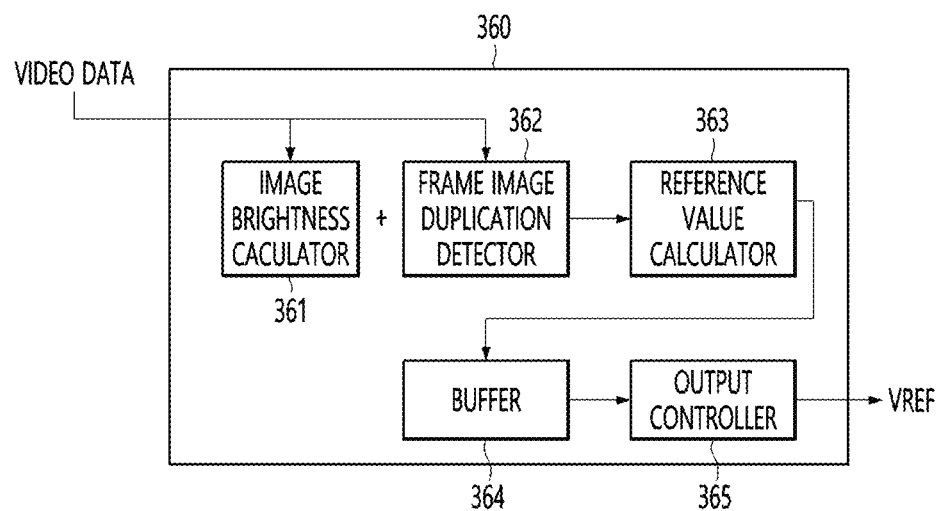
FIG. 13 is a block diagram illustrating a sensitivity adjuster.

FIG. 13 is a block diagram illustrating a sensitivity adjuster.

Referring to FIG. 13, the sensitivity adjuster 360 may comprise an image brightness calculator 361, a frame image duplication detector 362, and a reference value calculator 363.

The image brightness calculator 361 may calculate image brightness based on video data. The video data may comprise, for example, red data, green data, and blue data.

As a first example, the image brightness may be calculated based on video data for one frame. For example, the brightness value of red data, the brightness value of green data, and the brightness value of blue data of each pixel PX comprised in one frame may be calculated, and the sum of the calculated brightness values may be divided by (the number of pixels PX*3) to calculate an image brightness average value.

As an example, the image brightness may be calculated based on video data in units of pixels PX. For example, the sum of the brightness value of red data, the brightness value of green data, and the brightness value of blue data included in the pixel PX may be divided by 3 to calculate the image brightness average value.

As will be described later, when the sensing element 395 is installed in units of blocks (470 in FIG. 15) comprising a plurality of pixels PX, the image brightness can be calculated based on video data in units of blocks 470. For example, the sum of the brightness value of red data, the brightness value of green data, and the brightness value of blue data of each pixel PX included in the block 470 may be divided by (the number of pixels PX*3) to calculate the image brightness average value.

The frame image duplication detector 362 can detect whether there is a duplication in data brightness between the previous frame image and the current frame image.

For example, if 200 pixels PXs are provided, the brightness value of each of the 200 pixels PXs of the previous frame image and the brightness value of each of the 200 pixels PXs of the current frame image can be compared, and whether there is a duplication between the frame images can be detected based on the comparison result.

For example, if the brightness values of the previous frame image and the brightness values of the current frame image are the same in 100 or more pixels PXs among the 200 pixels PXs, the previous frame image and the current frame image can be determined to be duplicated.

For example, if the current frame image is determined to be duplicated with the previous frame image in this way, a correction value may not be obtained for the current frame image, or even if a correction value is set, it may be ignored. Accordingly, since the correction value is not reflected in the reference value VREF, the reference value VREF may not be changed.

The reference value calculator 363 can obtain a correction value based on the image brightness value provided from the image brightness calculator 361 and the information on whether there is duplication detected by the frame image duplication detector 362. The reference value calculator 363 can change the reference value VREF by reflecting the correction value to the reference value VREF.

Figure 14:
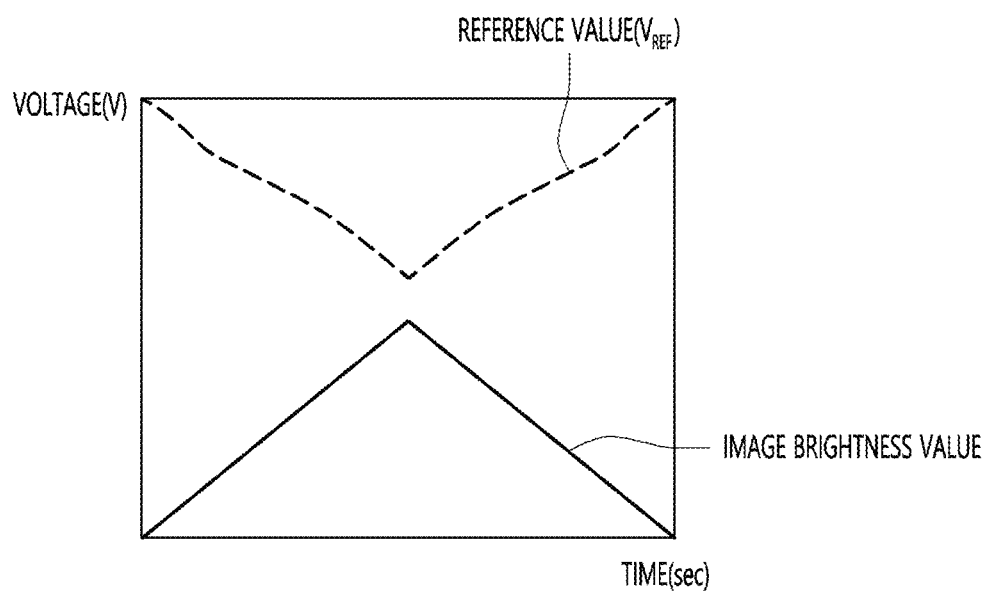
FIG. 14 illustrates a relationship between an image brightness value and a reference value.

As illustrated in FIG. 14, as the image brightness value increases, the correction value obtained from the reference value calculator 363 can increase. Accordingly, the reference value VREF obtained from the reference value calculator 363 can also be changed to increase.

As the image brightness value decreases, the reference value VREF can be changed to decrease based on the correction value that decreases.

As illustrated in FIG. 14, the image brightness value and the reference value VREF can be linearly inversely proportional. That is, as the image brightness value increases linearly, the reference value VREF decreases linearly, and as the image brightness value decreases linearly, the reference value VREF can increase linearly.

Meanwhile, the sensitivity adjuster 360 can comprise a buffer 364. The reference value VREF obtained from the reference value calculator 363 can be stored in the buffer 364.

The sensitivity adjuster 360 may comprise an output controller 365. The output controller 365 may output a reference value VREF output from the sensitivity adjuster 360 or a reference value VREF stored in the buffer 364. The reference value VREF output by the output controller 365 may be input to the second input terminal 442 of the comparator 440 of the second circuit block 372 illustrated in FIG. 10.

As a first example, the output controller 365 may control the output of the reference value VREF in response to a control signal provided from the processor 310 illustrated in FIG. 8. For example, the reference value VREF may be output in response to a high level of the control signal, and the output of the reference value VREF may be blocked by a low level of the control signal.

As an example, the output controller 365 may control the output of the reference value VREF in response to a scan signal $V_{SCAN}$. The reference value VREF may be output in response to the high level of the scan signal $V_{SCAN}$, and the output of the reference value VREF can be blocked by the low level of the scan signal VSCAN.

One of the output controller 365 and the third switch 430 of the second circuit block (372 of FIG. 10) may be omitted, but is not limited thereto.

As a first example, since the scan signal $V_{SCAN}$ is supplied to each pixel PX once per frame, the sensitivity adjuster 360 can output the reference value VREF to the second circuit block 372 of each pixel PX for each frame.

As a second example, the sensitivity adjuster 360 can periodically change or output the reference value VREF. For example, the sensitivity adjuster 360 can change or output the reference value VREF in units of several frames. This is to prevent the computational burden of the sensitivity adjuster 360 from being increased when changing or outputting the reference value VREF for each frame.

To this end, the output controller 365 may be provided with a control signal having a high level once every several frames from the processor (310 of FIG. 8). Accordingly, the output controller 365 may output the reference value VREF for several frames. At this time, the output reference value VREF may be a changed reference value VREF or an unchanged reference value VREF. If the frame images duplicate each other for several frames, the reference value VREF may not be changed.

At this time, the third switch 430 of the second circuit block 372 may also be controlled by the control signal provided from the processor (310 of FIG. 8).

For example, the sensitivity adjuster 360 may change the reference value VREF at a different cycle depending on the type of image.

Frame image duplication detector 362 can detect duplication between frame images. In this way, through frame image duplication detection, it can be determined whether the image is a still image, a moving image, an action video, a landscape image, a photographic image, etc.

Therefore, the reference value calculator 363 can change the reference value VREF at different cycles depending on the type of image based on the detection result of the frame image duplication detector 362.

For example, if a still image lasts 10 frames and then changes to a moving image, the reference value VREF can be changed based on the moving image after 10 frames.

For example, if a still image lasts 300 frames and then changes to a moving image, the reference value VREF can be changed based on the moving image after 300 frames.

For example, if a photographic image is displayed for 3 consecutive days and then changes to a moving image, the reference value VREF can be changed based on the moving image after 3 days.

Figure 15:
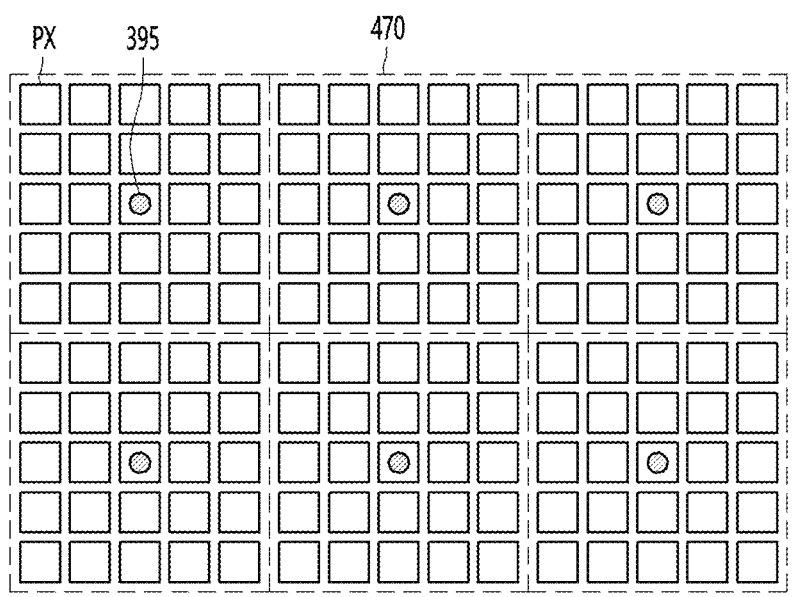
FIG. 15 illustrates a plurality of blocks.

FIG. 15 illustrates a plurality of blocks.

As illustrated in FIG. 15, a plurality of blocks 470 may be provided. Each of the blocks 470 may comprise a plurality of pixels PX.

Although six blocks 470 are illustrated in FIG. 15, the panel 301 may be provided with a number of blocks 470, which may be six or more.

In this case, at least one sensing element 395 may be disposed in each of the blocks 470. For example, the sensing element 395 may be disposed in a pixel PX located at the center of each of the blocks 470, but is not limited thereto. For example, the sensing element 395 may be disposed in two, four, or more in each of the blocks 470. The number of sensing elements 395 may be smaller than the number of pixels PX.

As described above, by not arranging the sensing elements 395 in each pixel PX but arranging them smaller than the number of pixels PX, a design margin can be secured and the computational burden of the second circuit block 372 connected to the sensing elements 395 can be reduced.

Figure 16:
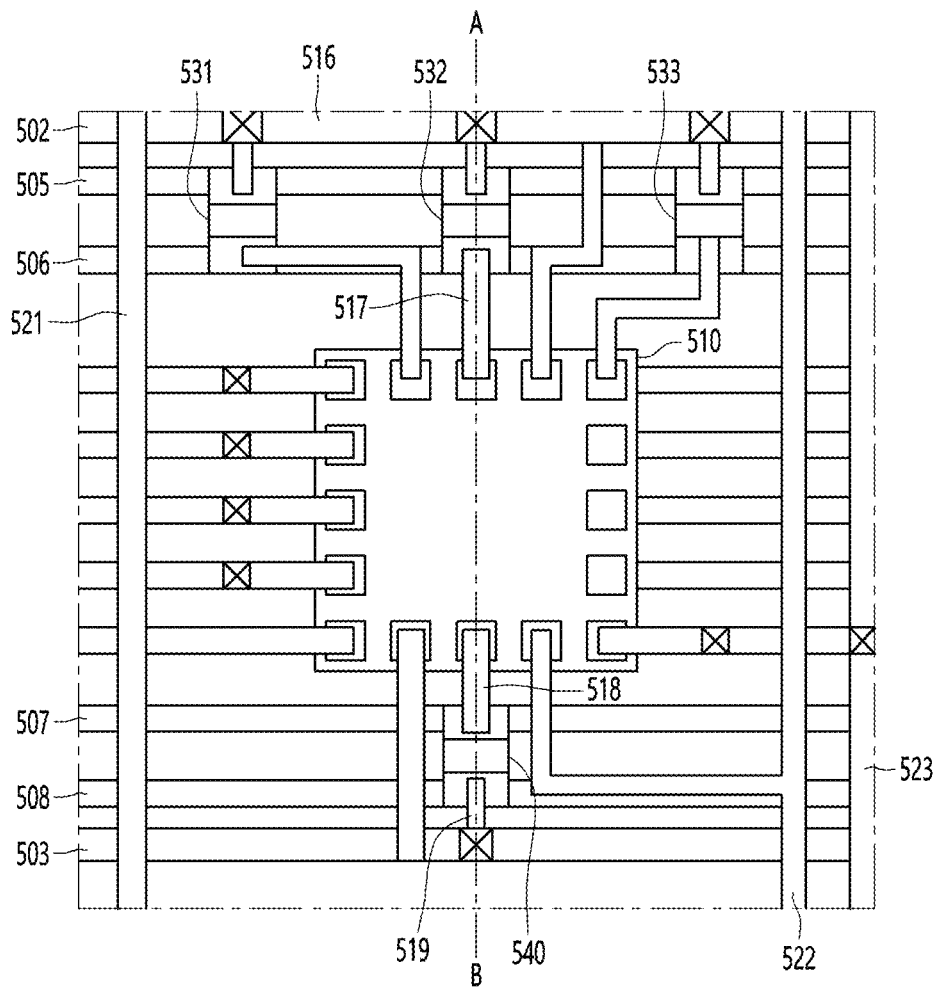
FIG. 16 illustrates a layout of a pixel.
Figure 17:
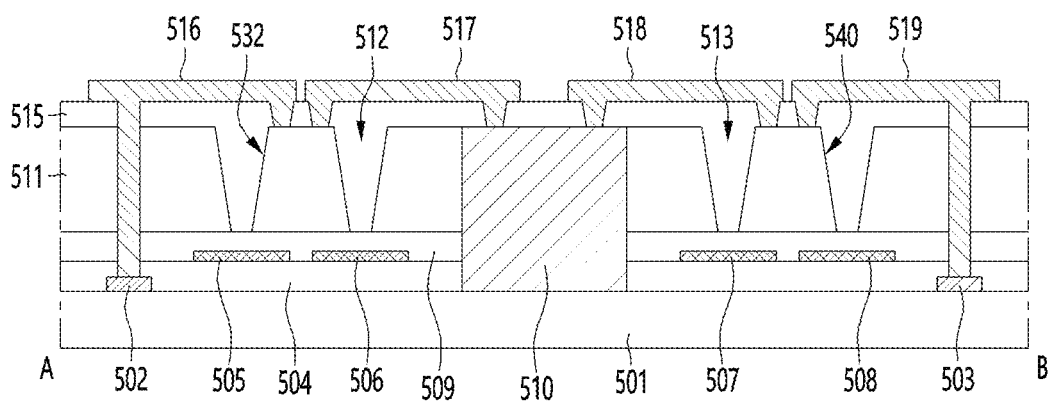
FIG. 17 is a cross-sectional view taken along line A-B of FIG. 16.

FIG. 16 illustrates the layout of the pixels. FIG. 17 is a cross-sectional view taken along the A-B line of FIG. 16.

As illustrated in FIGS. 16 and 17, the first semiconductor light-emitting device 531, the second semiconductor light-emitting device 532, the third semiconductor light-emitting device 533, and the fourth semiconductor light-emitting device 540 of the embodiment can be assembled using a self-assembly method. Since the assembly by the self-assembly method has already been described in detail above (FIGS. 5 and 6), a detailed description thereof will be omitted.

The substrate 501 can be prepared before the self-assembly process is performed.

As an example, a circuit block 510, which is an integrated circuit, may be mounted on the substrate 501. As another example, the circuit block 510 may be built into the substrate 501.

For example, the substrate 501 may be a backplane, and various wiring patterns may be formed.

A voltage wiring 502, a ground wiring 503, insulating layers 504 and 509, first assembling wirings 505 and 507, second assembling wirings 506 and 508, and a partition wall 511 may be formed through a post-process on the substrate 501 on which the circuit block 510 is mounted. A plurality of holes 512 and 513 may be formed in the partition wall 511.

The voltage wiring 502 and the ground wiring 503 may be a high-potential voltage line VDDL and a low-potential voltage line VSSL, respectively, as illustrated in FIG. 3, but are not limited thereto.

The first assembling wirings 505 and 507, the second assembling wirings 506 and 508, and the partition wall 511 may be the first assembling wiring 201, the second assembling wiring 202, and the partition wall 206, respectively, as illustrated in FIG. 5.

In FIG. 17, it may be illustrated that the voltage wiring 502 and the ground wiring 503 may be formed under the insulating layer 504, and the first assembly wirings 505 and 507 and the second assembly wirings 506 and 508 may be formed over the insulating layer 504, but this is not limited thereto. That is, the voltage wiring 502 and the ground wiring 503 may be formed on the insulating layer 504, and the first assembling wiring 505 and 507 and the second assembling wiring 506 and 508 may be formed under the insulating layer 504.

In FIG. 17, it may be illustrated that the insulating layers 504 and 509 and the partition wall 511 may be in contact with the side surface of the circuit block 510, but they may be spaced apart from each other, and another insulating layer may be formed in the spaced-apart space.

Using the self-assembly process illustrated in FIG. 6, the first semiconductor light-emitting device 531, the second semiconductor light-emitting device 532, the third semiconductor light-emitting device 533, and the fourth semiconductor light-emitting device 540 may be assembled into the corresponding holes 512 and 513 of the partition wall 511, as illustrated in FIG. 17. The holes 512 and 513 may be assembly holes for assembling the first semiconductor light-emitting device 531, the second semiconductor light-emitting device 532, the third semiconductor light-emitting device 533, and the fourth semiconductor light-emitting device 540, respectively. The holes 512 and 513 may be called grooves, recesses, through holes, etc.

The first semiconductor light-emitting device 531, the second semiconductor light-emitting device 532, the third semiconductor light-emitting device 533, and the fourth semiconductor light-emitting device 540, respectively, may be the first semiconductor light-emitting device 391, the second semiconductor light-emitting device 392, the third semiconductor light-emitting device 393, and the fourth semiconductor light-emitting device 394 illustrated in FIG. 7.

According to an embodiment, the first semiconductor light-emitting device 531, the second semiconductor light-emitting device 532, the third semiconductor light-emitting device 533, and the fourth semiconductor light-emitting device 540, respectively, may have a size of micrometers or less. For example, the first semiconductor light-emitting device 531, the second semiconductor light-emitting device 532, the third semiconductor light-emitting device 533, and the fourth semiconductor light-emitting device 540, respectively, may have a nanometer size.

An insulating layer 515 may be formed on the partition wall 511.

The insulating layers 504, 509, and 515 and the partition wall 511 may be formed of the same material or different materials. The at least one or more of the insulating layers 504, 509, and 515 and the partition wall 511 may be formed of an organic material.

By performing a contact hole forming process, a contact hole penetrating the insulating layer 515 or a contact hole penetrating the insulating layers 515, 509 and 504 and the partition wall 511 can be formed. Accordingly, a part of an upper surface of each of the voltage wiring 502, the ground wiring 503, the first semiconductor light-emitting device 531, the second semiconductor light-emitting device 532, the third semiconductor light-emitting device 533 and the fourth semiconductor light-emitting device 540 can be exposed to the outside.

A plurality of connection electrodes 516, 517, 518, and 519 may be formed on the insulating layer 515.

For example, the voltage wiring 502 may be electrically connected to each of the first semiconductor light-emitting device 531, the second semiconductor light-emitting device 532, and the third semiconductor light-emitting device 533 by the first connection electrode 516. For example, the first connection electrode 516 may be commonly connected to the first semiconductor light-emitting device 531, the second semiconductor light-emitting device 532, and the third semiconductor light-emitting device 533.

For example, the second semiconductor light-emitting device 532 may be electrically connected to the circuit block 510 by the second connection electrode 517. Likewise, the first semiconductor light-emitting device 531 and the third semiconductor light-emitting device 533 may be individually connected to the circuit block 510 by each of the second connection electrodes.

Among the wirings illustrated in FIG. 16, a plurality of wirings are data wirings, and video data comprising the red data, the green data, and the blue data may be provided to the circuit block 510. Depending on the grayscale values of each of the red data, the green data, and the blue data, the currents flowing through the first semiconductor light-emitting device 531, the second semiconductor light-emitting device 532, and the third semiconductor light-emitting device 533 may be different, and the luminance of the color light of each of the first semiconductor light-emitting device 531, the second semiconductor light-emitting device 532, and the third semiconductor light-emitting device 533 may be different due to the different currents.

For example, the circuit block 510 may be electrically connected to the fourth semiconductor light-emitting device 540 by the third connection electrode 518.

For example, the fourth semiconductor light-emitting device 540 may be electrically connected to the ground wiring 503 by the fourth connection electrode 519.

The fourth semiconductor light-emitting device 540 may generate a first sensing signal SENSE1 based on external light or internal light by a power source having a reverse bias, and may output a second sensing signal SENSE2 based on the first sensing signal SENSE1 and a reference value VREF by the circuit block 510. The fourth semiconductor light-emitting device 540 may be a sensing element, such as a photo diode, a photo detector, a photo sensor, a photo receiver, etc.

Although not indicated by a reference symbol in FIG. 16, FIG. 16 illustrates a scan line 521 that supplies a scan signal $V_{SCAN}$ illustrated in FIG. 10, a clock line that supplies a clock signal $V_{CLK}$, a plurality of data lines 522 that supply serial digital data, i.e., video data, and a detection line 523 that outputs a second sensing signal SENSE2.

The above detailed description should not be construed as limiting in all respects and should be considered illustrative. The scope of the embodiment should be determined by reasonable interpretation of the appended claims, and all changes within the equivalent range of the embodiment are included in the scope of the embodiment.

The embodiment can be adopted in the display field for displaying images or information. The embodiment can be adopted in the display field for displaying images or information using a semiconductor light-emitting device. The semiconductor light-emitting device can be a micro-level semiconductor light-emitting device or a nano-level semiconductor light-emitting device.

For example, the embodiments can be adopted in TVs, signage, smart phones, mobile phones, mobile terminals, HUDs for vehicles, backlight units for notebooks, and display devices for VR or AR.

What is claimed is:

1. A display device, comprising:
first to third semiconductor light-emitting devices in each of a plurality of pixels;
a sensing element; and
a circuit block in each of the plurality of pixels,
wherein an image is configured to be displayed in units of frames, and
wherein one frame comprises a first section driven in an emission mode and a second section driven in a sensing mode,
wherein the first to third semiconductor light-emitting devices are configured to emit light during the first section by a power source having a forward bias,
wherein the sensing element comprises a fourth semiconductor light-emitting device,
wherein a first sensing signal is configured to output from the fourth semiconductor light-emitting device during the second section by a power source configured to output a power having a reverse bias,
wherein a sensitivity adjustment circuit is configured to change a reference value to adjust a sensitivity of the first sensing signal, and
wherein the sensitivity adjustment circuit comprises an image brightness calculator, a frame image duplication detector, and a reference value calculator.

2. The display device of claim 1, wherein the circuit block comprises:
a first circuit block configured to control an emission of each of the first to third semiconductor light-emitting devices; and
a second circuit block configured to control a detection of a second sensing signal.

3. The display device of claim 2, wherein the second section comprises a second-first section and a second-second section, and
wherein the second circuit block comprises:
a comparator configured to output the second sensing signal based on the first sensing signal and the reference value;

a first switch configured to control to apply the power having the reverse bias to the fourth semiconductor light-emitting device during the second-first section; and a second switch configured to control the output of the second sensing signal during the second-second section.

4. The display device of claim 3, wherein the second circuit block comprises:

a third switch configured to control an application of the reference value to a second input terminal of the comparator.

5. The display device of claim 4, wherein the second circuit block comprises:

a capacitor configured to store the applied reference value between the comparator and the third switch.

6. The display device of claim 1, wherein the sensitivity adjustment circuit is configured to obtain a correction value based on a brightness of the image, and change the reference value based on the correction value.

7. The display device of claim 1, wherein the sensitivity adjustment circuit is configured to periodically change the reference value.

8. The display device of claim 1, wherein the sensitivity adjustment circuit is configured to change the reference value at different cycles depending on a type of the image.

9. The display device of claim 1, wherein the sensing element is disposed in each of the plurality of pixels.

10. The display device of claim 1, wherein the plurality of pixels are comprised in a plurality of blocks, wherein the sensing element is disposed in each of the plurality of blocks.

11. The display device of claim 10, the sensing element is disposed in a pixel located at a center of each of the plurality of blocks.

12. The display device of claim 1, wherein the sensing element comprises one of a photo diode, a photo detector, and a photo sensor.

13. The display device of claim 1, further comprising:

a partition wall having a plurality of holes on a substrate, wherein the first to fourth semiconductor light-emitting devices is disposed in the holes, respectively.

14. The display device of claim 13, wherein the circuit block is built into the substrate.

15. The display device of claim 14, wherein the circuit block comprises an integrated circuit disposed on the substrate.

* * * * *